(12) United States Patent
Taylor

(10) Patent No.: US 6,974,969 B2
(45) Date of Patent: Dec. 13, 2005

(54) P-TYPE QUANTUM-WELL-BASE BIPOLAR TRANSISTOR DEVICE EMPLOYING INTERDIGITATED BASE AND EMITTER FORMED WITH A CAPPING LAYER

(75) Inventor: Geoff W. Taylor, Storrs-Mansfield, CT (US)

(73) Assignee: The University of Connecticut, Farmington, CT (US)

( * ) Notice: Subject to any disclaimer, the term of this patent is extended or adjusted under 35 U.S.C. 154(b) by 133 days.

(21) Appl. No.: 10/700,016

(22) Filed: Nov. 3, 2003

(65) Prior Publication Data

US 2004/0135161 A1 Jul. 15, 2004

Related U.S. Application Data

(63) Continuation-in-part of application No. 10/340,941, filed on Jan. 13, 2003, and a continuation-in-part of application No. 10/340,942, filed on Jan. 13, 2003, now Pat. No. 6,841,795.

(51) Int. Cl.[7] .................. H01L 21/331; H01L 29/06
(52) U.S. Cl. .......................... 257/24; 438/309
(58) Field of Search .................. 438/309, 39; 365/149; 257/194, 192, 187, 184, 24, 21, 20, 14, 12

(56) References Cited

U.S. PATENT DOCUMENTS

| | | | |
|---|---|---|---|
| 3,919,656 A | 11/1975 | Sokal et al. | 330/51 |
| 4,424,525 A | 1/1984 | Mimura | 357/23 |
| 4,573,064 A * | 2/1986 | McLevige et al. | 257/198 |
| 4,658,403 A | 4/1987 | Takiguchi et al. | 372/96 |
| 4,683,484 A | 7/1987 | Derkits, Jr. | 357/16 |
| 4,806,997 A | 2/1989 | Simmons et al. | 357/16 |
| 4,814,774 A | 3/1989 | Herczfeld | 342/372 |
| 4,827,320 A | 5/1989 | Morkoc et al. | 357/22 |
| 4,829,272 A | 5/1989 | Kameya | 333/139 |

(Continued)

OTHER PUBLICATIONS

*10–Gb/s High–Speed Monolithically Integrated photoreceiver Using InGaAs p–i–n PD and Planar Doped InAlAs/InGaAs HEMT's* by Akahori et al, IEEE Photonics Technology Letters, vol. 4, No. 7, Jul. 1992.

*10–Gbit/s InP–Based High–Performance Monolithic Photoreceivera Consisting of p–i–n Photodiodes and HEMT's* by Takahata et al., IEICE Trans. Electron., vol. E83–C, No. 6 Jun. 2000.

(Continued)

Primary Examiner—Craig A. Thompson
Assistant Examiner—Monica D. Harrison
(74) Attorney, Agent, or Firm—Gordon & Jacobson, P.C.

(57) ABSTRACT

A high performance bipolar transistor device is realized from a series of layers formed on a substrate, the series of layers including a first set of one or more layers each comprising n-type dopant material, a second set of layers forming a p-type modulation doped quantum well structure, and a third set of one or more layers each comprising n-type dopant material. The first set of layers includes an n-type ohmic contact layer. A collector terminal metal layer is deposited and patterned on one layer of the third set. P-type ion implant regions and a patterned base terminal metal layer (which contact the p-type modulation doped quantum well structure) are formed in an interdigitated manner with respect to a patterned emitter metal layer formed on the n-type ohmic contact layer. Preferably, a capping layer that covers the sidewalls of the active device structure (as well as covering the collector metal layer) is used to form the interdigitated base and emitter metal layers of the device. One or more of the metal layers of the device are preferably formed from a composite metal structure (such as a NiInW composite metal structure) that is transformed into a low resistance metal layer by a rapid-thermal anneal operation.

40 Claims, 18 Drawing Sheets

U.S. PATENT DOCUMENTS

| | | | |
|---|---|---|---|
| 4,899,200 A | 2/1990 | Shur et al. | 357/30 |
| 4,949,350 A | 8/1990 | Jewell et al. | 372/45 |
| 5,003,366 A | 3/1991 | Mishima et al. | 257/197 |
| 5,010,374 A | 4/1991 | Cooke et al. | 357/16 |
| 5,105,248 A | 4/1992 | Burke et al. | 357/24 |
| 5,202,896 A | 4/1993 | Taylor | 372/50 |
| 5,288,659 A | 2/1994 | Koch et al. | 438/31 |
| 5,337,328 A | 8/1994 | Lang et al. | 372/45 |
| 5,386,128 A | 1/1995 | Fossum et al. | 257/183.1 |
| 5,422,501 A | 6/1995 | Bayraktaroglu | 257/195 |
| 5,436,759 A | 7/1995 | Dijaili et al. | 359/333 |
| 5,452,118 A | 9/1995 | Maruska | 398/204 |
| 5,698,900 A | 12/1997 | Bozada et al. | 257/744 |
| 5,999,553 A | 12/1999 | Sun | 372/50 |
| 6,031,243 A | 2/2000 | Taylor | 257/13 |
| 6,037,616 A | 3/2000 | Amamiya | 257/198 |
| 6,043,519 A | 3/2000 | Shealy et al. | 257/195 |
| 6,239,475 B1 | 5/2001 | Johansson et al. | 257/488 |
| 6,479,844 B2 | 11/2002 | Taylor | 257/98 |
| 6,483,170 B2 | 11/2002 | Johansson | 257/580 |
| 6,720,584 B2 | 4/2004 | Hata et al. | 257/98 |
| 2002/0067877 A1 | 6/2002 | Braun et al. | |

OTHER PUBLICATIONS

*10–Ghz Bandwidth Monolithic p–i–n Modulation–doped Field Effect Transistor Photoreceiver* by Dutta et al., Appl. Phys. Lett., vol. 63, No. 15, Oct. 11, 1993.

*20 Gbit/s Long Wavelength Monolithic Integrated Photoreceiver Grown on GaAs* by Hurm, et al., Electronics Letters, vol. 33, No. 7, Mar. 27, 1997.

*Monolithic Integrated Optoelectronic Circuits* by Berroth et al., Fraunhofer Institute for Applied Solid State Physics (IAF), Germany, IEEE 1995.

*Heterojunction Field–Effect Transistor* (HFET), Reprinted from Electronics Letters, vol. 22, No. 15, pp. 784–786, Jul. 17, 1986.

*High Temperature Annealing of Modulation Doped GaAs/AlGaAs Heterostructures for FET Applications* by Lee et al., 1983 IEEE/Cornell Conf. On High–Speed Semiconductor Device & Ckts, Aug. 1983.

*Submicrometre Gate Length Scaling of Inversion Channel Heterojunction Field Effect Transistor* by Kiely et al., Electronics Letters, vol. 30, No. 6 Mar. 17, 1994.

*Theoretical and Experimental Results for the Inversion Chennel Heterostructure Field Effect Transistor* by Taylor et al., IEE Proceedings–G, vol. 140, No. 6, Dec. 1993.

*Transmitting Transistor Design: RF Transmitting Transistor and power amplifier fundamentals*, Phillips Semiconductors; Mar. 23, 1998.

*Thermally Stable Ohmic Contacts to n–type GaAS. VIII. Sputter–deposited InAs Contacts*: HJ Kim, Masanori Murakami, SL Wright, M. Norcott, WH Price and D. La Tulipe; Apr. 11, 1990.

*Thermally Stable Ohmic Contact to n–type GaAs IX. Sputter–deposited InAs Contacts Niln(mn) and Niln(w) Contact Metals*, J. Applied Physics, vol. 70, Nov. 12, 1991 pp. 7443–7448.

*Transferred Substrate HBT's with 254 GH2F.* D. Mensa et al.; Electron Lett. Apr. 1999; 35(7) pp. 605–606.

\* cited by examiner

| Layer Material | Layer Doping Type | Typical Doping Concentration (atoms/cm³) | Typical Layer Thickness (A) | Layer # |
|---|---|---|---|---|
| InGaAs | P+ | 1E20 | 25 | 165b |
| GaAs | P+ | 1E20 | 75 | 165a |
| Al(0.7)Ga(0.3)As | P | 1E17 | 700 | 164b |
| Al(0.7)Ga(0.3)As | P+ | 1E19 | 10 | 164a |
| Al(.15)Ga(.85)As | P+ | 3.5E18 | 25 | 163d |
| Al(.15)Ga(.85)As | und | und | 200 - 300 | 163c |
| Al(.15)Ga(.85)As | N+ | 3.5E18 | 80 | 163b |
| Al(.15)Ga(.85)As | und | und | 20-30 | 163a |
| GaAs | und | und | 15 | 162 |
| In(.20)Ga(.80)AsN  ⎫ x3 | und | und | 60 | 161 |
| GaAs              ⎭ | und | und | 100 | 160b |
| GaAs | und | und | 100 - 250 | 160a |
| Al(.15)Ga(.85)As | und | und | 5000 | 159 |
| GaAs | und | und | 100 | 158 |
| In(.20)Ga(.80)AsN ⎫x3 | und | und | 60 | 157 |
| GaAs | und | und | 15 | 156 |
| Al(.15)Ga(.85)As | und | und | 30 | 155d |
| Al(.15)Ga(.85)As | P+ | 3.5E18 | 80 | 155c |
| Al(.15)Ga(.85)As | und | und | 300 | 155b |
| Al(.15)Ga(.85)As | N+ | 3.5E18 | 80 | 155a |
| Al(0.7)Ga(0.3)As | N | 1E17 | 700 | 154 |
| GaAs | N+ | 3.5E18 | 2200 | 153 |
| AlAs | und | und | 1701 | 151 |
| GaAs   ⎫ x7 | und | und | 696 | 152 |
| AlAs   ⎭ | und | und | 1701 | 151 |
| GaAs Substrate | | SI | | 149 |

FIG. 2A

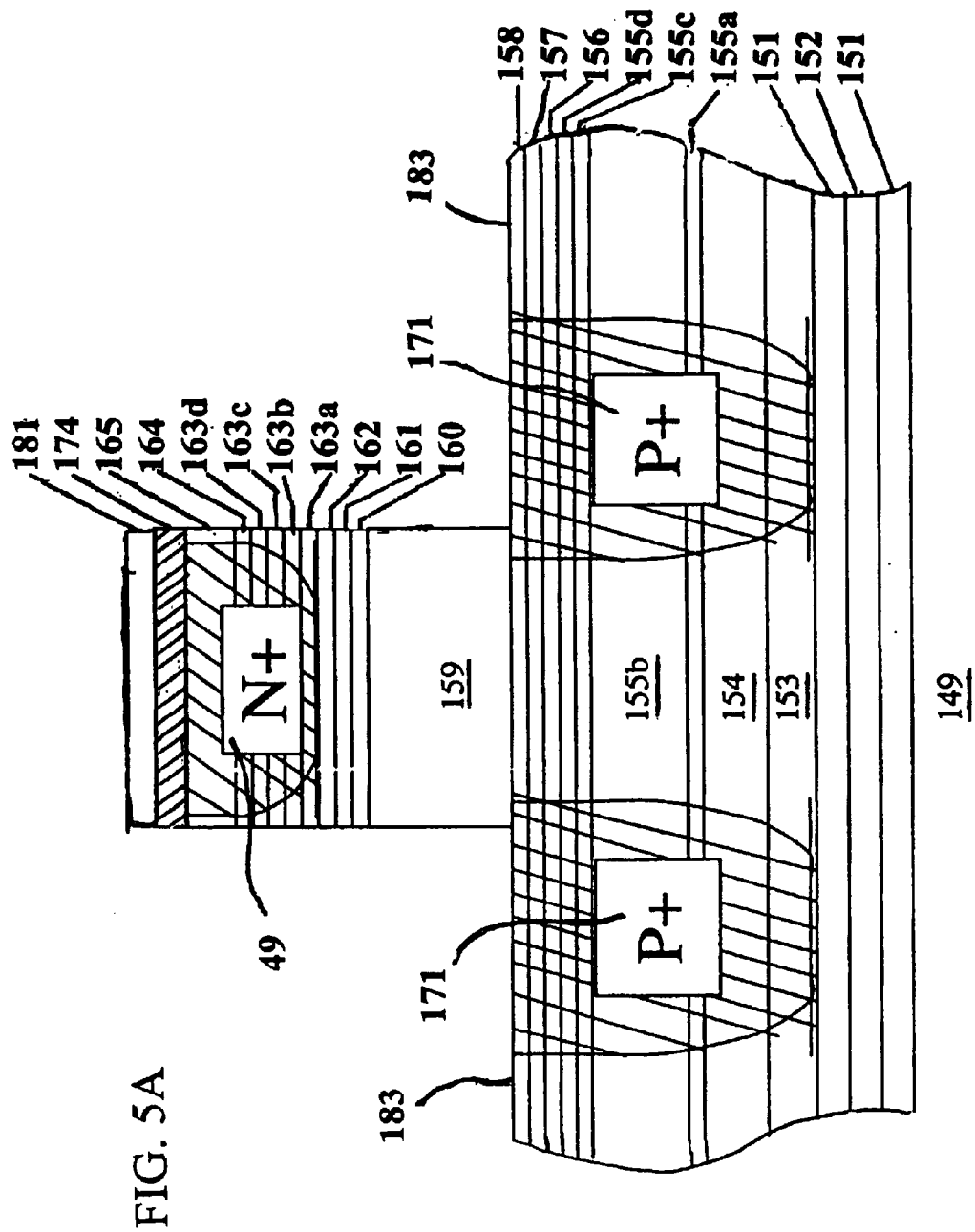

P-TYPE QUANTUM-WELL-BASE BIPOLAR TRANSISTOR DEVICE EMPLOYING INTERDIGITATED BASE AND EMITTER FORMED WITH A CAPPING LAYER

CROSS-REFERENCE TO RELATED APPLICATION

This application is a continuation-in-part of co-owned U.S. application Ser. Nos. 10/340,941 and 10/340,942, which is now Pat. No. 6,841,795 both filed on Jan. 13, 2003, herein incorporated by reference in their entirety.

BACKGROUND OF THE INVENTION

1. Field of the Invention

This invention relates broadly to field of semiconductor devices (and associated fabrication methodology) and, in particular, to semiconductor devices (and associated fabrication methodology) that utilize modulation doped quantum well heterojunctions to realize optoelectronic/electronic devices.

2. State of the Art

Modulation-doped quantum well heterojunction transistors—including well known Pseudomorphic Pulsed Doped High Electron Mobility Transistors (Pulsed Doped PHEMT), which are sometimes referred to as Pulsed Doped Modulation Doped Field Effect Transistors (Pulsed Doped MODFET) or Pulsed Doped Two Dimensional Gas Field Effect Transistors (Pulsed Doped TEGFET)—have become well recognized for their superior low noise and high frequency performance and are now in demand in many high frequency applications (e.g., front end amplifier in wireless communications systems and in Monolithic Microwave and Millimeterwave IC (MMIC) designs).

GaAs/InGaAs/AlxGa$_{1-x}$As is the III–V material system of choice for these devices because of the ability to grow high optical/electrical quality epitaxial layers by molecular beam epitaxy (MBE). Alternatively, strained silicon heterostructures employing silicon-germanium (SiGe) layers have been used to produce such devices.

U.S. Pat. No. 4,827,320 to Morkoc et al. discloses a pseudomorphic HEMT (PHEMT) structure that employs a layer of strained InGaAs (undoped) between a GaAs substrate and a layer of undoped AlGaAs to form a quantum well (QW) defined by the strained InGaAs layer. A layer of n+ doped AlGaAs is formed on the undoped AlGaAs layer. A layer of n+ GaAs is formed on the layer of n+ doped AlGaAs. The layer of n+ GaAs facilitates an ohmic contact to source/drain electrodes. A gate electrode of aluminum is recessed below the layer of n+ GaAs and a portion of the n+ AlGaAs layer by wet chemical etch and evaporation of aluminum.

The PHEMT structure has been very successful in producing microwave transistors that operate well into the multi-gigahertz regime, initially being used extensively in military systems and now finding their way into commercial products, particularly in the area of cellular communications. In recent years, there has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser, PIN diode, etc.

To achieve this goal, inversion channel heterojunction structures created from a single epitaxial growth have been used to realize a range of optoelectronic devices including lasers, detectors and field effect transistors (FETs). An exemplary inversion channel heterojunction structure is described in Taylor and Kiely, "Theoretical and Experimental Results for the Inversion Channel Heterostructure Field Effect Transistors", IEE Proceedings-G, Vol. 140, No. 6, December 1993. In this structure, for the region between the modulation doping layer and the gate of the semiconductor surface, the doping of this region is substantially p type in order to provide a low resistance ohmic contact for the gate of the FET.

However, the high p-type doping of this region creates many problems, including:

i) the effects of free carrier absorption makes formation of a vertical cavity laser difficult;

ii) forming a depletion-type FET by implanting n-type dopant is difficult;

this difficulty stems from the difficulty in controlling the dopant density in the bulk region; more specifically, compensating a large p density with a large n density to obtain a lower p density is difficult to control in a bulk region (but much easier in a delta doped region);

iii) controlling the threshold voltage of an enhancement type FET is difficult because the input capacitance is a function of doping which is harder to control than layer thickness; and iv) producing effective current funneling for inducing lasing is difficult;

more specifically, it is very desirable to create a pn junction by N type implantation to steer the current in this structure since this would be compatible with the overall approach to building the FET devices; the heavy p doping bulk layers makes it difficult to create junction isolation that has low leakage.

Heterojunction Bipolar Transistor (HBT) devices have also been developed for high frequency applications. An HBT device includes a base layer structure disposed between an emitter layer structure and a collector layer structure. The base layer structure may utilize a graded composition (as described in U.S. Pat. No. 6,037,616) or a modulation doped QW structure (as described in U.S. Pat. No. 5,003,366). A transferred-substrate process may be used wherein the emitter is epitaxially grown on a substrate, and the collector is epitaxially grown on the top of the sample. By depositing the collector as a small feature on the top surface of the sample and etching a collector mesa, a minimum collector capacitance is realized. At this point, the sample is flipped and mounted on a low resistance ground plane, and the substrate below the emitter is removed by etching so that processing of the emitter and base can begin in a conventional manner from the top side. An exemplary transferred-substrate process for HBTs is described in D. Mensa et al., "Transferred-substrate HBTs with 254 GHz F$_T$," Electron. Lett., April 1999, 35(7), pp. 605–606. These prior art devices provide for improved current gain and cutoff frequency with respect to prior art silicon bipolar transistors. However, it is difficult to realize a range of optoelectronic devices (including lasers, detectors, FET devices, waveguide devices) from the epitaxial growth that is used to form such HBT devices.

SUMMARY OF THE INVENTION

It is therefore an object of the invention to provide a bipolar transistor device suitable for high frequency applications that can be used to realize within a single integrated circuit chip a wide range of optoelectronic devices (including lasers, detectors, FET devices, complementary HFET devices with n-channel and p-channel control elements respectively, etc).

It is another object of the invention to provide such a bipolar transistor device with reduced base resistance and capacitance as well as reduced emitter resistance and capacitance to thereby improve the frequency response characteristics of the device.

In accord with these objects, which will be discussed in detail below, a high performance bipolar transistor device is realized from a series of layers formed on a substrate, the series of layers including a first set of one or more layers each comprising n-type dopant material, a second set of layers forming a p-type modulation doped quantum well structure, and a third set of one or more layers each comprising n-type dopant material. The first set of layers includes an n-type ohmic contact layer. A collector terminal metal layer is deposited and patterned on one layer of the third set. On both sides of the collector terminal metal layer, p-type ion implant regions and a patterned base terminal metal layer (which contact the p-type modulation doped quantum well structure) are formed in an interdigitated manner with respect to a patterned emitter metal layer formed on the n-type ohmic contact layer. Preferably, a capping layer that covers the sidewalls of the active device structure as well as the collector metal layer is used to form the interdigitated base and emitter metal layers of the device. These features reduce the base resistance and capacitance as well as reduce the emitter resistance and capacitance and thus enable higher frequency operation. One or more of the metal layers of the device are preferably formed from a composite metal structure (such as a NiInW composite metal structure) that is transformed into a low resistance metal layer by a rapid-thermal anneal operation.

Additional objects and advantages of the invention will become apparent to those skilled in the art upon reference to the detailed description taken in conjunction with the provided figures.

BRIEF DESCRIPTION OF THE DRAWINGS

FIG. 2A is a schematic showing an exemplary layer structure made with group III–V material in accordance with the present invention, and from which bipolar transistor devices of the present invention can be made;

FIGS. 3A–10 are schematic views of the structure of FIG. 2A during fabrication of an exemplary p-type quantum-well-base transistor from such structure; FIG. 3A is a cross-sectional schematic view of the structure showing the formation of the collector metal layer; FIG. 4 is an elevational schematic view of the interdigitated base and emitter metal layer that is disposed on opposite sides of the collector metal layer; FIGS. 5A and 5B are cross-sectional schematic views of the structure showing the mesas upon which is formed the base metal layer and the emitter metal layer, respectively; FIG. 10 an elevational schematic view of the completed device, including the interdigitated base and emitter metal layers.

DETAILED DESCRIPTION OF THE PREFERRED EMBODIMENTS

The present invention builds upon novel device structures utilizing modulation-doped QW heterojunctions that do not suffer from the problems associated with the prior art PHEMT devices and HBT devices. Such novel device structures are described in detail in the following patent references: U.S. Pat. No. 6,031,243; U.S. patent application Ser. No. 09/556,285, filed on Apr. 24, 2000; U.S. patent application Ser. No. 09/798,316, filed on Mar. 2, 2001; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. patent application Ser. No. 60/376,238, filed on Apr. 26, 2002; and U.S. application Ser. No. 10/280,892, filed on Oct. 25, 2002; each of these references herein incorporated by reference in its entirety.

Figure 1A:
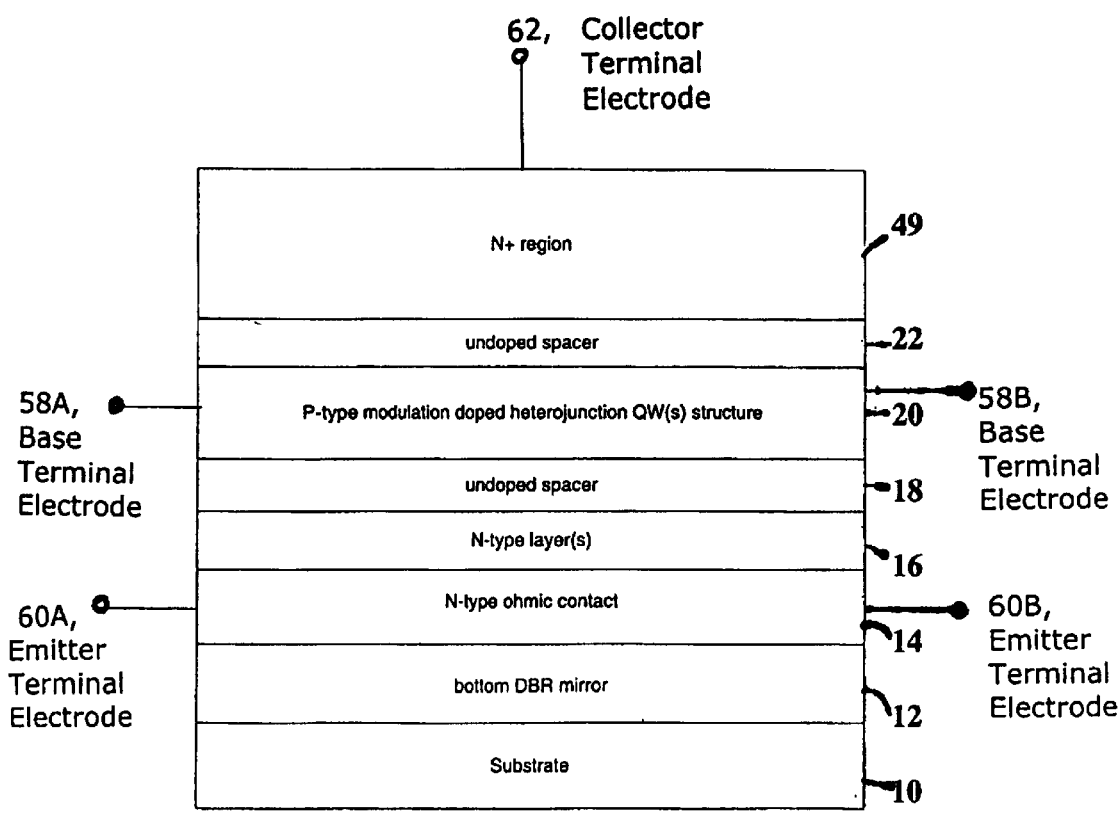
FIG. 1A is a cross-sectional schematic showing the generalized construction of an exemplary p-type quantum-well-base bipolar transistor in accordance with the present invention.

Turning now to FIG. 1A, a multi-layer sandwich structure in accordance with the present invention, and from which devices of the present invention can be made, includes a bottom dielectric distributed bragg reflector (DBR) mirror 12 formed on a substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure which consists of a p-type modulation doped quantum well structure 20 sandwiched between a bottom n-type region (layers 14,16) and a top n-type region 49. An undoped spacer layer 18 is disposed between the bottom n-type region and the p-type modulation doped quantum well structure 20. An undoped spacer layer 22 is disposed between the p-type modulation doped quantum well structure 20 and the top n-type region 49.

More particularly, the bottom n-type ohmic contact layer(s) 14 enables the formation of ohmic contacts thereto, such as the emitter terminal electrodes 60A, 60B. Deposited on layer 14 are one or more n-type layer(s) 16. Preferably, the doping of layer(s) 16 is such that it should not be depleted in any range of operation of the device, i.e. the total doping in this layer should exceed the total doping charge contained in the modulation doped layer of the p-type modulation doped QW structure 20 described below. This layer 16 also serves optically as a small part of the lower waveguide cladding for optical devices realized in this structure. Note that a majority of the lower waveguide cladding is provided by the lower DBR mirror 12 itself. Deposited on layer 16 is an undoped spacer layer 18. Layers 14, 16 and 18 serve electrically as part of the emitter of the p-type quantum well base bipolar transistor. In this configuration, layer 14 achieves low contact resistance for the emitter.

Deposited on layer 18 is a p-type modulation doped QW structure 20 that defines one or more quantum wells (which may be formed from strained or unstrained heterojunction materials) that serve electrically as part of base of the p-type quantum well base bipolar transistor. Deposited on the p-type modulation doped QW structure 20 is an undoped spacer layer 22 followed by an n-type region 49. The undoped spacer layer 22 and the n-type region 49 serve electrically as part of the collector of the p-type quantum well base bipolar transistor. The n-type region 49 provides an ohmic contact for the collector terminal electrode 62 of the p-type quantum well base bipolar transistor.

For the p-type quantum well base bipolar transistor, base terminal electrodes 58A, 58B are operably coupled to opposite sides of the p-type QW structure 20, emitter terminal electrodes 60A, 60B are operably coupled to opposite sides of the n-type contact layer 14, and a collector terminal electrode 62 is operably coupled to the top n-type region 49 of the device. Preferably, the base terminal electrode 58A and emitter terminal electrode 60A on the one side of the device have an interdigitated structure, while the base terminal electrode 58B and emitter terminal electrode 60B on the other side of the device also have an interdigitated structure. Such interdigitated structures decrease the base terminal resistance as well as the emitter terminal resistance.

In addition, as will be discussed in detail hereinafter with reference to FIGS. 2A–9, the device is preferably formed with a capping layer that is deposited to cover the active device structure prior to metallization of the base terminal electrodes and the emitter terminal electrodes. This capping layer, which is preferably a nitride film, enables the base and emitter metal layer pattern to be moved in a lateral direction closer to the active device structure, which also decreases the base terminal resistance and the emitter terminal resistance. By decreasing such resistance values, the transconductance ($g_m$) and cutoff frequency of the device is increased. In this manner, the device can be used in higher frequency applications.

Figure 1B:
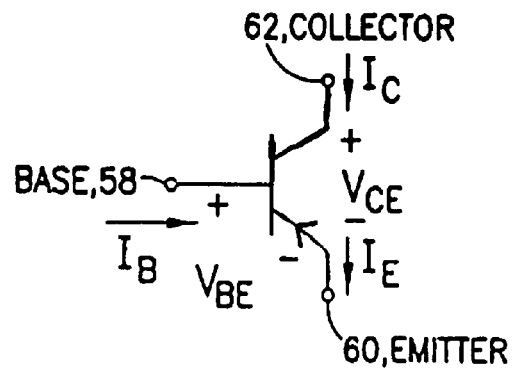
FIG. 1B is a pictorial illustration of an exemplary configuration of the p-type quantum-well-base bipolar transistor device of FIG. 1A.
Figure 1C:
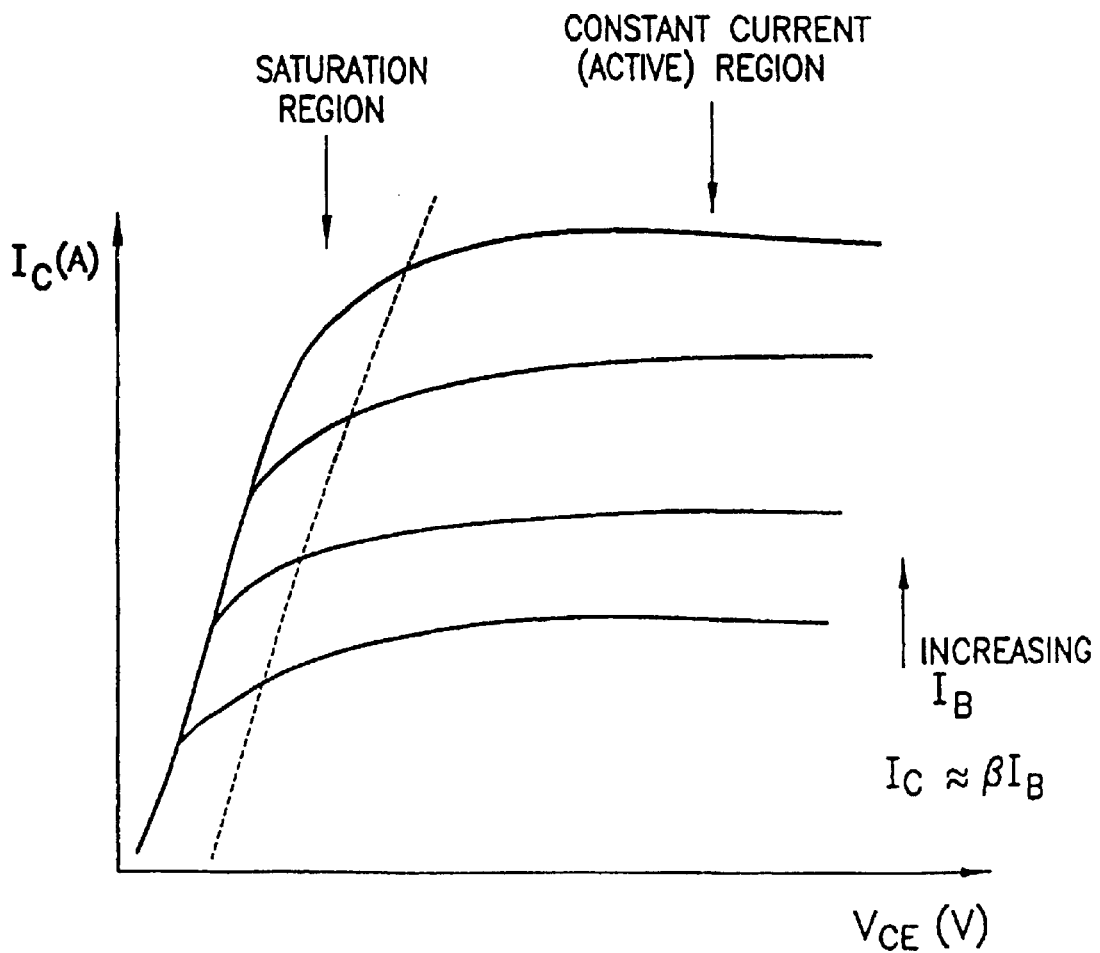
FIG. 1C is a graph showing the generalized current-voltage characteristics of the p-type quantum-well-base bipolar transistor device of FIGS. 1A and 1B.

FIGS. 1B and 1C illustrate the operational characteristics of the p-type quantum-well-base bipolar transistor device of FIG. 1A. Under normal operation, the base terminal electrodes 58A, 58B are forward biased with respect to the emitter terminal electrodes 60A, 60B by a voltage level $V_{BE}$, and the collector terminal electrode 62 is forward biased with respect to the emitter terminal electrodes 60A, 60B by a voltage level $V_{CE}$ as shown in FIG. 1B. For small values of $V_{CE}$, the device operates in the saturation region where the current $I_C$ varies in a quasi-linear manner with respect to $V_{CE}$ as shown in FIG. 1C. For larger values of $V_{CE}$, the device operates in the constant current region where the current $I_C$ is substantially constant with respect to $V_{CE}$ as shown in FIG. 1C.

The p-type quantum well base bipolar transistor is preferably integrated with one or more other devices, including transistor devices (such as n-type quantum well base bipolar transistors, complementary HFET transistors), optoelectrical devices (such as resonant cavity lasers, detectors, modulators, optical amplifiers) and passive optical devices (such as waveguides). Preferably, such devices are realized from the inversion quantum-well channel device structures as described in detail in the patent references incorporated by reference above. With these structures, a single fabrication sequence is used to make the devices, including the electrical devices (e.g., transistors) and the optoelectronic devices (e.g., laser/detector/modulator). In other words, a single set of n type and p type contacts, critical etches, dielectric depositions etc. are used to realize these devices simultaneously. The essential features of this device structure include 1) a modulation doped quantum well interface, 2) a refractory metal gate/emitter contact, 3) self-aligned channel contacts formed by ion implantation, 4) n-type metal contacts to the n-type ion implants and the bottom n-type layer, and 5) p-type metal contacts to the p-type layers.

To form a resonant cavity device where light enters into and/or is emitted from the device laterally (i.e., from a direction normal to the cross section of FIG. 1A), a diffraction grating and top dielectric mirror are formed over the active device structure. For resonant cavity lasing devices, the diffraction grating performs the function of diffracting light produced by the resonant cavity into light propagating laterally in a waveguide which has the top dielectric mirror and bottom DBR mirror as waveguide cladding layers. For resonant cavity detecting devices, the diffraction grating performs the function of diffracting incident light that is propagating in the lateral direction into a vertical mode, where it is absorbed resonantly in the resonant cavity.

Alternatively, light may enter (and/or exit) the resonant cavity in a vertical direction through an optical aperture (not shown) in the top surface (or bottom surface) of the device. In this case, the diffraction grating is omitted, and the top dielectric mirror and bottom DBR mirror define a resonant cavity for the vertical emission (and/or absorption) of light such that the device operates as a vertical cavity surface emitting laser (detector).

The optical path length between the bottom DBR mirror and top dielectric mirror preferably represents an integral number of ½ wavelengths at the designated wavelength. The optical path length is controlled to enable this condition.

The epitaxial growth structures described above may be realized with a material system based on group III–V materials (such as a GaAs/AlGaAs). Alternatively, strained silicon heterostructures employing silicon-germanium (SiGe) layers may be used to realize the multilayer structures described herein. FIG. 2A illustrates an exemplary epitaxial growth structure utilizing group III–V materials for realizing the structure of FIG. 1A and the optoelectrical/electrical/optical devices formed from this structure in accordance with the present invention.

The structure of FIG. 2A can be made, for example, using known molecular beam epitaxy (MBE) techniques. As shown, a first semiconductor layer 151 of AlAs and a second semiconductor layer 152 of GaAs are alternately deposited (with preferably at least seven pairs) upon a semi-insulating gallium arsenide substrate 149 in sequence to form the bottom distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. This center wavelength is selected such that all of the resonant wavelengths for the various cavities of the array will be subject to high reflectivity. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 11, which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is an n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the emitter terminal of a p-type quantum-well-base bipolar device, the cathode terminal of a thyristor device, the gate terminal of an inverted p-channel HFET device, or the sub-collector terminal of an n-channel HFET device). Layer 153 has a typical thickness of 1000–3000 Å and a typical n-type doping of $3.5 \times 10^{18}$ cm$^{-3}$. The N+ doped GaAs layer 153 corresponds to the ohmic contact layer 14 of FIG. 1A. Deposited on layer 153 is layer 154 of n-type $Al_{x1}Ga_{1-x1}As$ with a typical thickness of 500–3000 Å and a typical doping of $1 \times 10^{17}$ cm$^{-3}$. The parameter x1 is preferably in the range between 70% and 80% for layer 154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are 4 layers (155a, 155b, 155c, and 155d) of $Al_{x2}Ga_{1-x2}As$. These 4 layers (collectively, 155) have a total thickness about 380–500 Å and where x2 is about 15%. The first layer 155a is about 60–80 Å thick and is doped N+ type in the form of delta doping. The second layer 155b is about 200–300 Å thick and is undoped. The third layer 155c is about 80 Å thick and is doped P+ type in the form of delta doping. The fourth layer 155d is about 20–30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 1A, and the undoped AlGaAs layer 155b corresponds to the undoped spacer layer 18 of FIG. 1A.

The next layers define the quantum well(s) that form the inversion channel(s) during operation of the PHFET 11. For a strained quantum well, this includes a spacer layer 156 of undoped GaAs that is about 10–25 Å thick and then combinations of a quantum well layer 157 that is about 40–80 Å thick and a barrier layer 158 of undoped GaAs. The quantum well layer 157 may be comprised of a range of compositions. In the preferred embodiment, the quantum well is formed from an $In_{0.2}Ga_{0.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.5 μm, the nitrogen content will be approximately 4–5%. The well barrier combination will typically be repeated (for example, three times as shown), however single quantum well structures may also be used. Unstrained quantum wells are also possible. Following the last barrier of undoped GaAs is a layer 159 of undoped $Al_{x2}Ga_{1-x2}As$ which serves electrically as part of the collector of the PHFET device 11 and is about 0.5 μm in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 1A. Undoped AlGaAs layer 159 corresponds to the undoped spacer layer 22 of FIG. 1A.

Layer 159 also serves electrically as part of the collector of the NHFET device 13. Deposited on layer 159 are two layers (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 160 includes a single layer 160a of about 150 Å and a barrier layer 160b of about 100 Å. The next layer 161 is the quantum well of $In_{0.2}Ga_{0.8}As$, which is undoped and about 40–80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10–30 Å of undoped GaAs which accommodates a growth interruption and a change of growth temperature. Next there are four layers (collectively 163) of $Al_{x2}Ga_{1-x2}As$ of about 300–500 Å total thickness. These four layers (163) include a spacer layer 163a of undoped $Al_{x2}Ga_{1-x2}As$ that is about 20–30 Å thick, a modulation doped layer 163b of N+ type doping of $Al_{x2}Ga_{1-x2}As$ (with doping about $3.5 \times 10^{18}$ cm$^{-3}$) that is about 80 Å thick, a spacer layer 163c of undoped $Al_{x2}Ga_{1-x2}As$ that is about 200–300 Å thick, and a P+ type delta doped layer 163d of $Al_{x2}Ga_{1-x2}As$ (with doping about $3.5 \times 10^{18}$ cm$^{-3}$) that is about 60–80 Å in thickness. Layers 163b and 163d form the top plate and bottom plate of a parallel plate capacitor which forms the field-effect input to all active devices. The doping species for layer 163d is preferably carbon (C) to ensure diffusive stability. In contrast to layer 163b which is always depleted, layer 163d should never be totally depleted in operation. For the optoelectronic device operation, layer 163 is the upper SCH region. The layers between the undoped GaAs barrier layer 160a and the N+ AlGaAs layer 163b provide an n-type modulation doped heterojunction QW structure 24. Undoped AlGaAs layer 163c corresponds to the undoped spacer layer 26 of FIG. 1A.

One or more layers (collectively 164) of p-type $Al_{x1}Ga_{1-x1}As$ are deposited next to form part of the upper waveguide cladding for the laser, amplifier and modulator devices. Note that a majority of the upper waveguide cladding for waves propagating in the guide formed by the optically active region of the device is provided by an upper dielectric mirror as described below. The upper dielectric mirror causes the light to be guided partially as a dielectric waveguide and partially as a mirror waveguide. Preferably, layer 164 has a thickness on the order of 500–1500 Å, and includes a first thin sublayer 164a that is 10–20 Å thick and has a P+ doping of $10^{19}$ cm$^{-3}$ and a second sublayer 164b that is 700 Å thick and has a P doping of $1\times10^{17}$–$5\times10^{17}$ cm$^{-3}$. The parameter x1 of layer 164 is preferably about 70%.

Deposited next is an ohmic contact layer 165 (which may comprise a single layer of GaAs or a combination of GaAs (165a) and InGaAs (165b) as shown). Layer 165 is about 50–100 Å thick and is doped to a very high level of P+ type doping (about $1\times10^{20}$ cm$^{-3}$) to enable formation of ohmic contacts thereto (for example, when contacting to the anode terminal of a thyristor device).

Alternatively, the active device structure may be described as a pair of stacked quantum-well-base bipolar transistors formed on the bottom DBR mirror (layers 151/152). The first of these is an p-type quantum-well-base bipolar transistor (comprising layers 153 through 159) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the bottom n-type layers (layers 153 through 155a) and the undoped spacer layer 155b serve electrically as part of the emitter of the p-type quantum-well-base bipolar transistor (as well as part of the cathode of a thyristor device), the p-type QW structure (layers 155c though 158) serves electrically as part of the base of the p-type quantum-well-base bipolar transistor, and spacer layer 159 serves electrically as part of the collector of the p-type quantum-well-base bipolar transistor (as well as part of the collection of an n-type quantum-well-base bipolar transistor). The n-type QW structure (layers 160a through 163b) serves electrically as part of the base of an n-type quantum-well-base bipolar transistor. The top p-type layers (layers 163d through 165b) and the undoped spacer layer 163c serve electrically as part of the emitter of the n-type quantum-well-base bipolar transistor as well as part of the anode of the thyristor device.

Figure 2B:
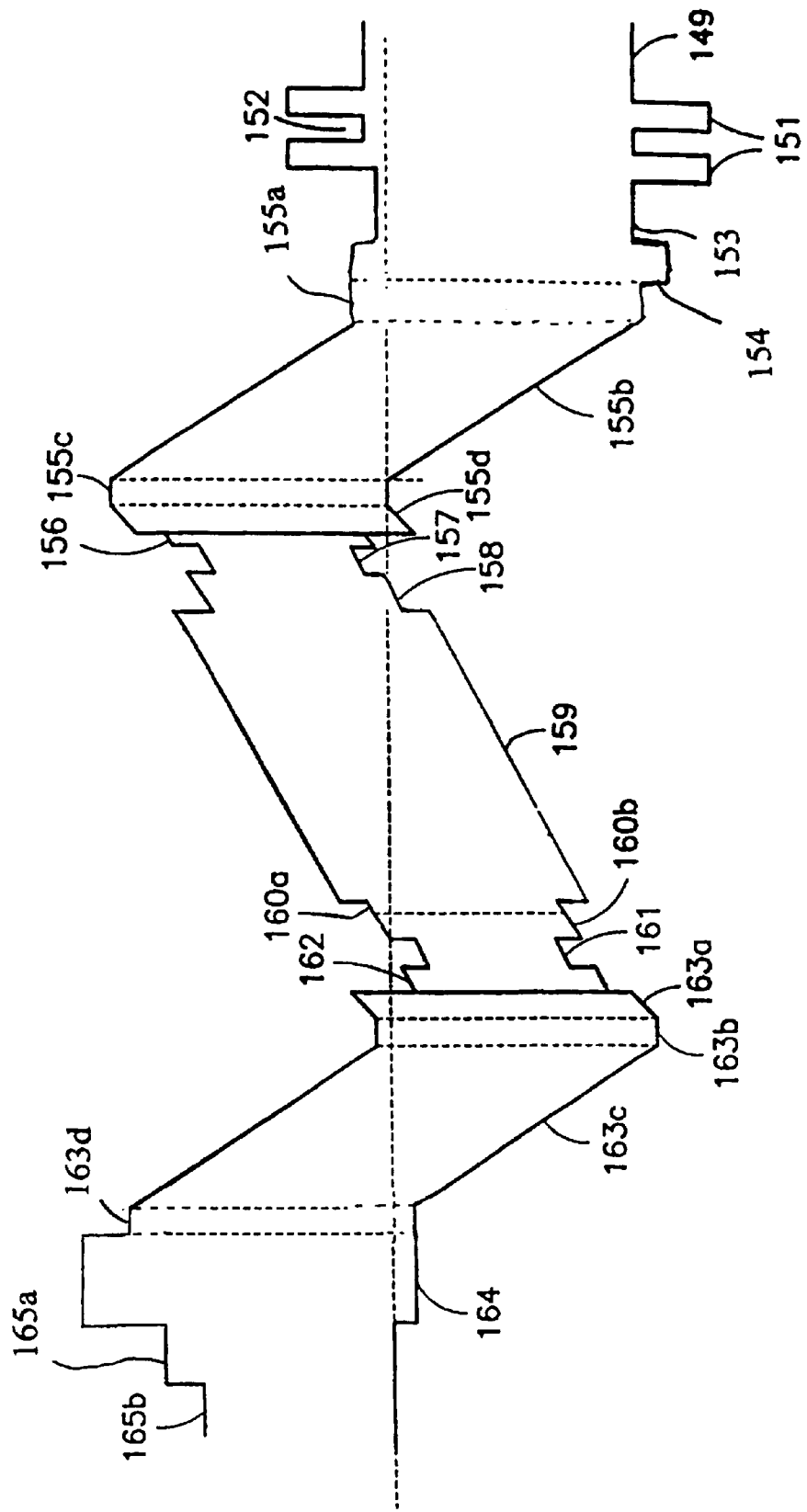
FIG. 2B shows the energy band diagram of the structure of FIG. 2A.

FIG. 2B shows the energy band diagram of the structure of FIG. 2A.

To form a resonant cavity device where light is input into and emitted from the device laterally (i.e., from a direction normal to the cross section of FIG. 2A), a diffraction grating (for example, as described in detail in U.S. Pat. No. 6,031,243) and top DBR mirror is formed over the active device structure described above. For vertical cavity lasing devices, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ½ wavelengths at the designated wavelength. Preferably, the thickness of layer 164 and/or layer 159 is adjusted to enable this condition.

The structure of FIGS. 2A and 2B may also be used to realize various transistor devices (including p-type quantum-well-base bipolar transistors, n-type quantum-well-base bipolar transistors, n-channel HFET devices, p-channel HFET devices) as well as waveguide devices as described in detail in the patent references incorporated by reference above.

Figure 3A:
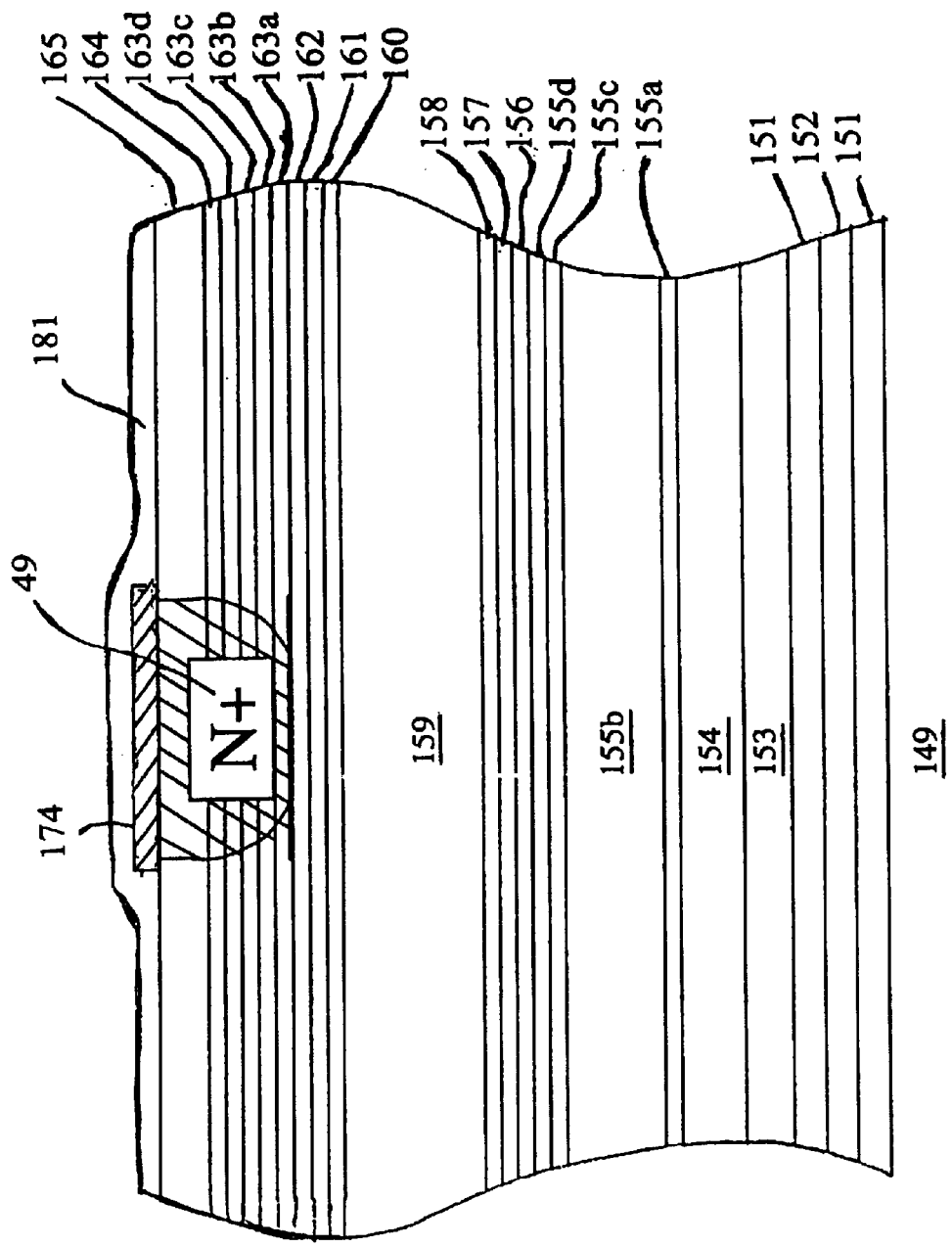
Figure 3B:
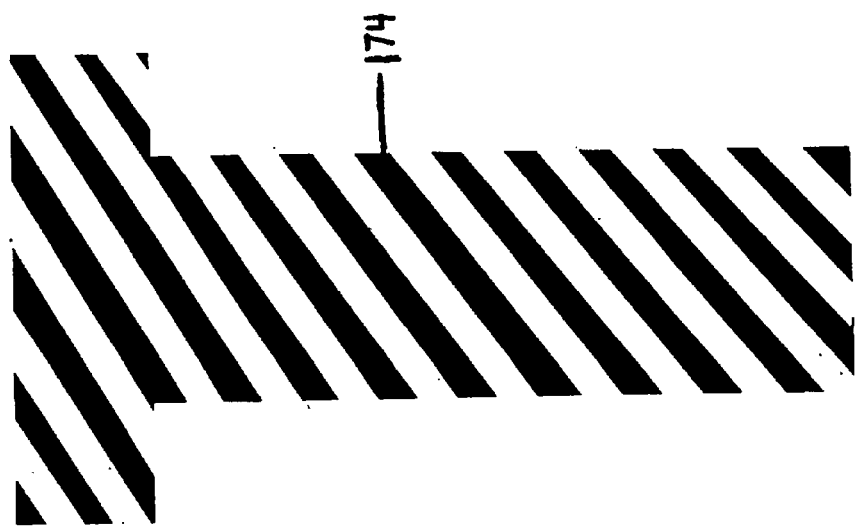
FIG. 3B is an elevational schematic view of the collector metal layer.

FIGS. 3A through 9 illustrate cross-sectional views and elevational views of the multilayer structure of FIG. 2A during the fabrication of an exemplary p-type quantum-well-base bipolar transistor. The operations begin by implanting n-type ions, which preferably comprise silicon ions through the top p-type structure (layers 163d through layer 165b). The n-type implanted ions may include impurities, such as silicon fluoride molecules, which aid in reducing the activation temperature for the implanted ions. The n-type implanted ions are subsequently activated by a rapid-thermal-anneal (RTA) operation as described below to form an n-type region 49. The n-type implant region 49 serves electrically as part of the collector of the p-type quantum well base bipolar transistor, and thus will be covered by collector metal layer 174 as described below. Preferably, the N-type implant region 49 extends to a depth near layer 162 as shown in FIG. 3A. In this configuration, layers 159 through 162 correspond to the undoped spacer layer 22 of FIG. 1A for the p-type quantum well base bipolar transistor.

A metal layer 174 and capping layer 181 are deposited and defined over the n-type implant region 49. The capping layer 181, which preferably comprises a silicon nitride film, covers the metal layer 174 as shown in FIG. 3A. The metal layer 174 forms the collector terminal as best shown in the elevational view of FIG. 3B. Preferably, the metal layer 174 comprises a composite metal structure formed by depositing Nickel (Ni), Indium (In) and Tungsten (W) metals, which is transformed during an RTA operation as set forth below into a thermally-stable low resistance metal layer in contact with the n-type implant region 49. Exemplary NiInW composite metal structures are described in Murakami et al., "Thermally stable ohmic contacts to n-type GaAs. VIII Sputter-deposited InAs contacts," J. Appl. Physics, Vol. 68, No. 5, 1990, pgs. 2475–2481; and Hallili et al., "Thermally stable ohmic contacts to n-type GaAs. IX. NiInW and NiIn(Mn)W Contact Metals," J. Appl. Physics, Vol. 70, No. 12, 1991, pgs. 7443–7448, herein incorporated by reference in their entireties. Such composite metal structures include an InAs/W multilayer structure, an InAs/Ni/W multilayer structure, an Ni/InAs/Ni/W multilayer structure, and Ni/Ni—In/Ni/W multilayer structure (where the Ni—In layer is formed by codeposition of Ni and In). In the preferred embodiment of the present invention, the same composite metal structure is used to form low resistance metal contact layers to both the n-type and p-type GaAs conduction channels of the device.

Figure 4:
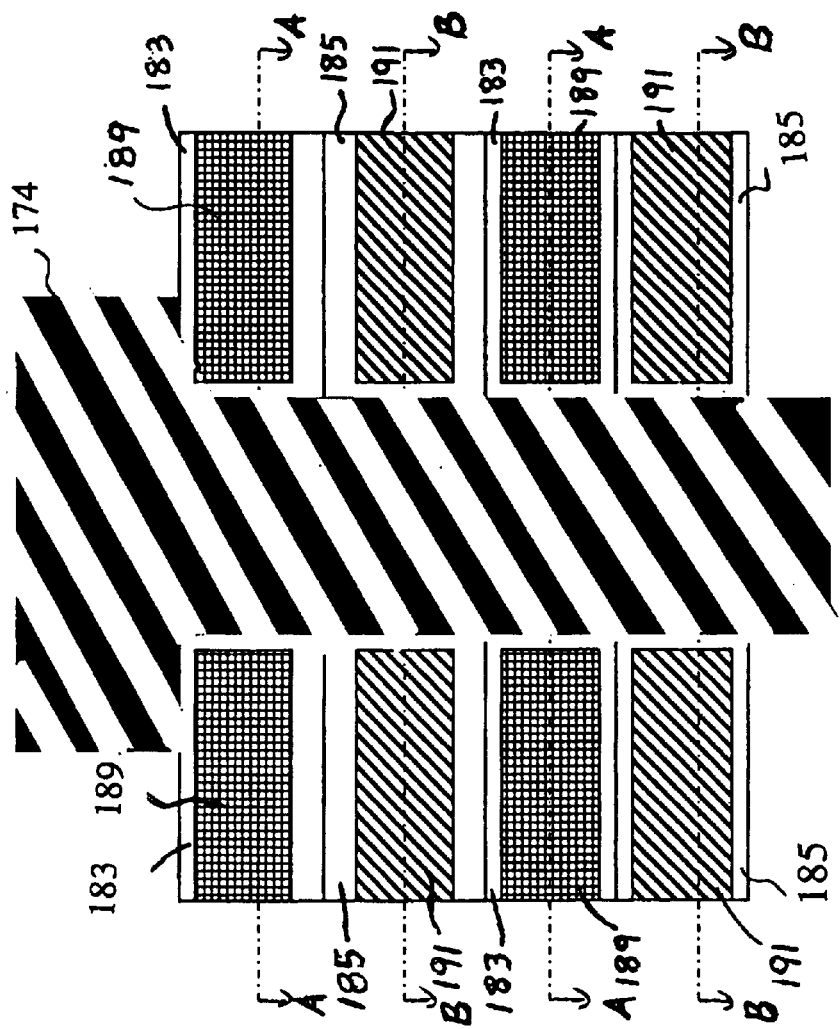
Figure 5B:
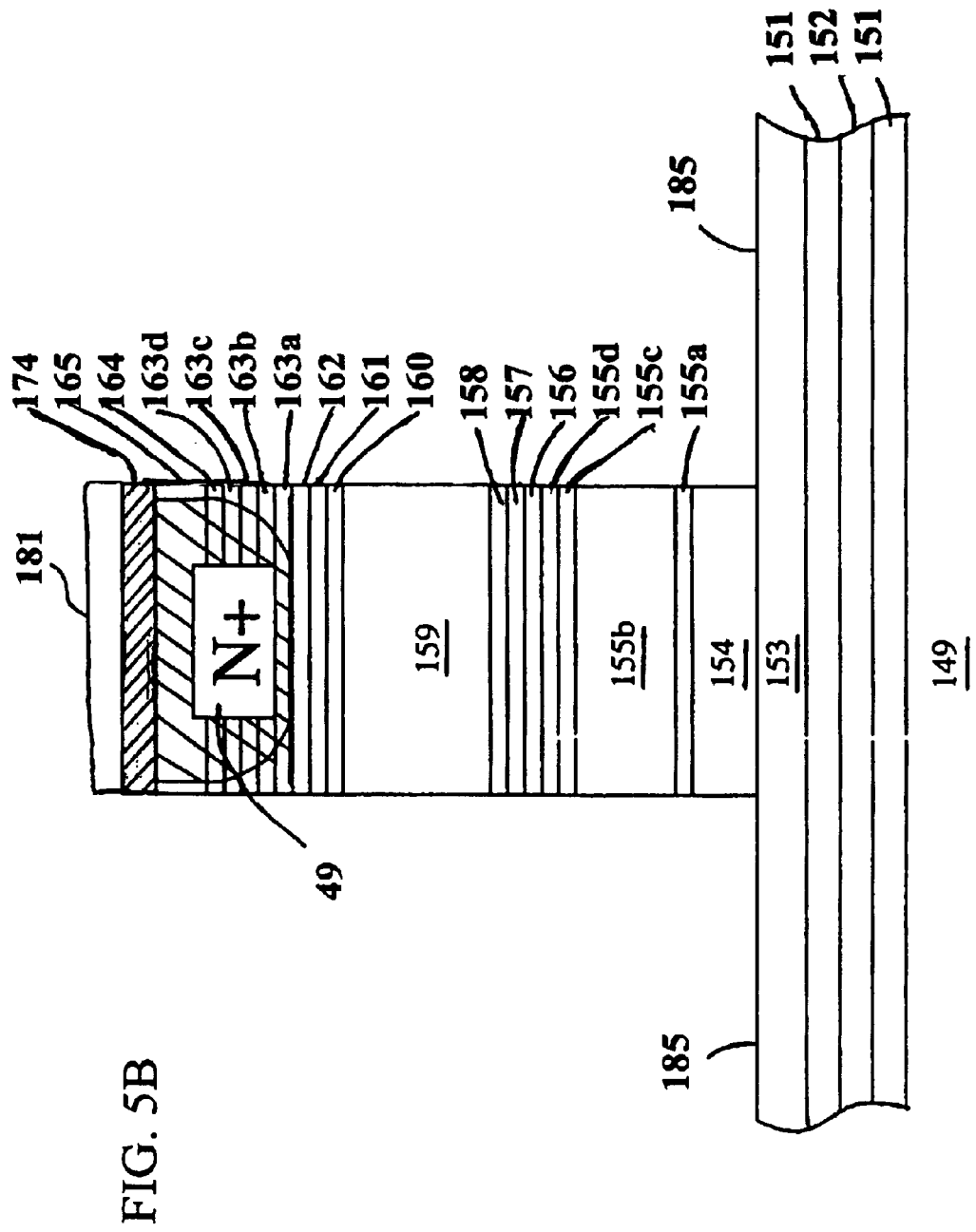

The resultant structure is subjected to patterning and etching operations that expose two sets of interdigitated mesa regions 183, 185 on each side of the collector metal layer 174 as shown in FIG. 4. The mesa regions 183 are formed at (or near) layer 158 as shown in FIG. 5A, and the mesa regions 185 are formed at (or near) layer 153 as shown in FIG. 5B. The mesa regions 183 are used to form contacts to the p-type QW structure (layers 155c through 158) as part of the base terminal electrode of the device. The mesa regions 185 are used to form contacts to the bottom n-type ohmic contact layer 153 as part of the emitter terminal electrode of the device. Preferably, a mask covers the capping layer 181 (and the metal layer 174 thereunder) during a directional plasma etching operation that forms sidewalls that extend from the edges of the top capping layer 181 down in a substantially-vertical direction to the mesa regions 183 and 185.

P-type ions are implanted into the mesa regions 183 on both sides of the collector metal layer 174. When activated, the p-type ions form p-type implant regions 171 as shown in FIG. 5A. Advantageously, the p-type implant regions 171 are self-aligned by the collector metal layer 174 as shown. The p-type ions used for the p-type implant regions 171 may comprise magnesium ions and possibly phosphorous ions. Alternatively, the p-type ions may comprise beryllium (and possibly other impurities, such as fluorine, that control diffusion of the p-type ions during RTA activation). Moreover, other impurities, such as manganese, may be implanted in conjunction with the p-type ions in order to lower the potential barrier between the composite metal structure of layer 188 and the p-type implant regions 171 upon thermal transformation as described below.

Figure 6A:
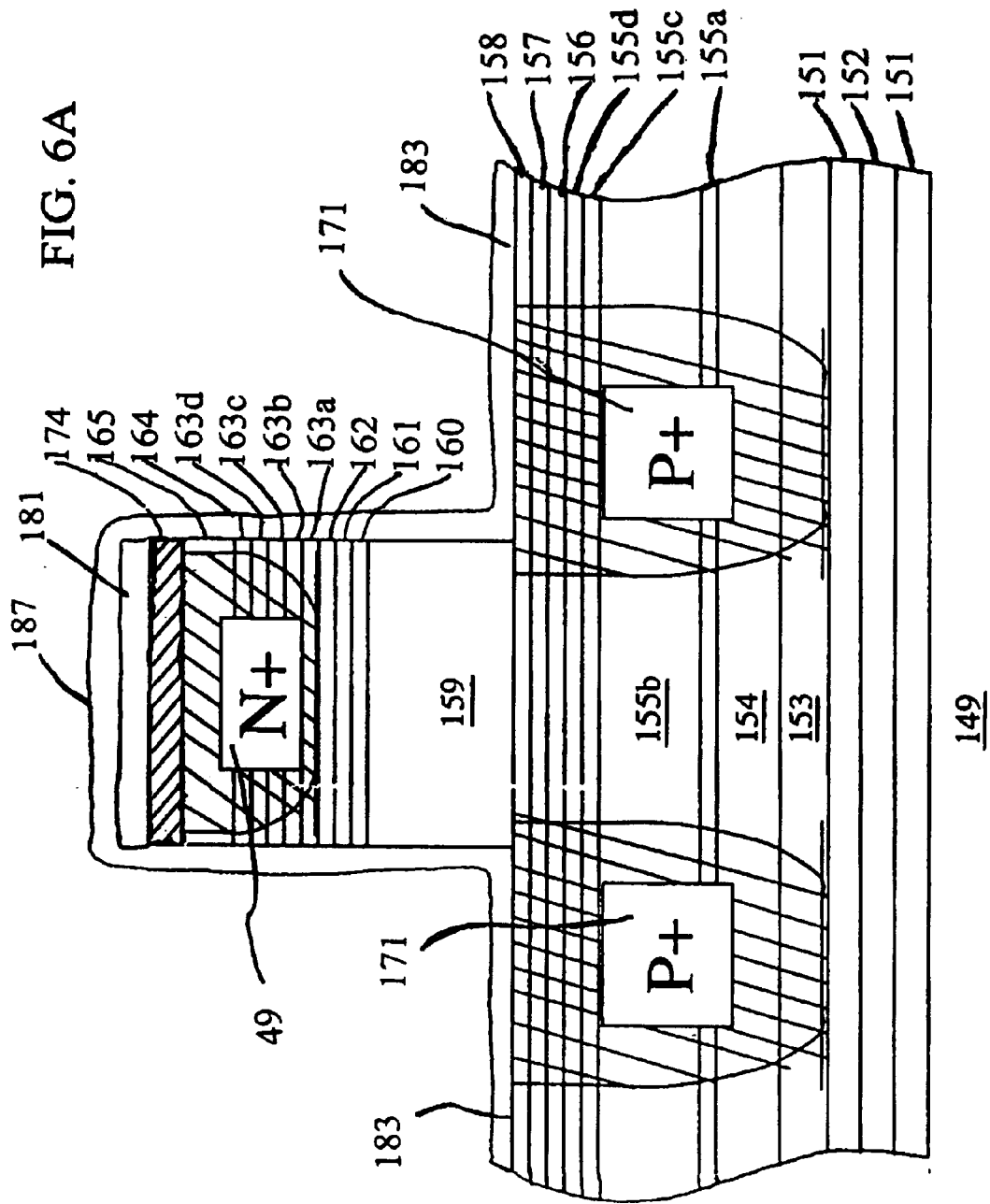
FIGS. 6A and 6B are cross-sectional schematic views that show a capping layer (preferably a nitride film) that covers the mesas of FIGS. 5A and 5B as well as the active device structure.
Figure 6B:
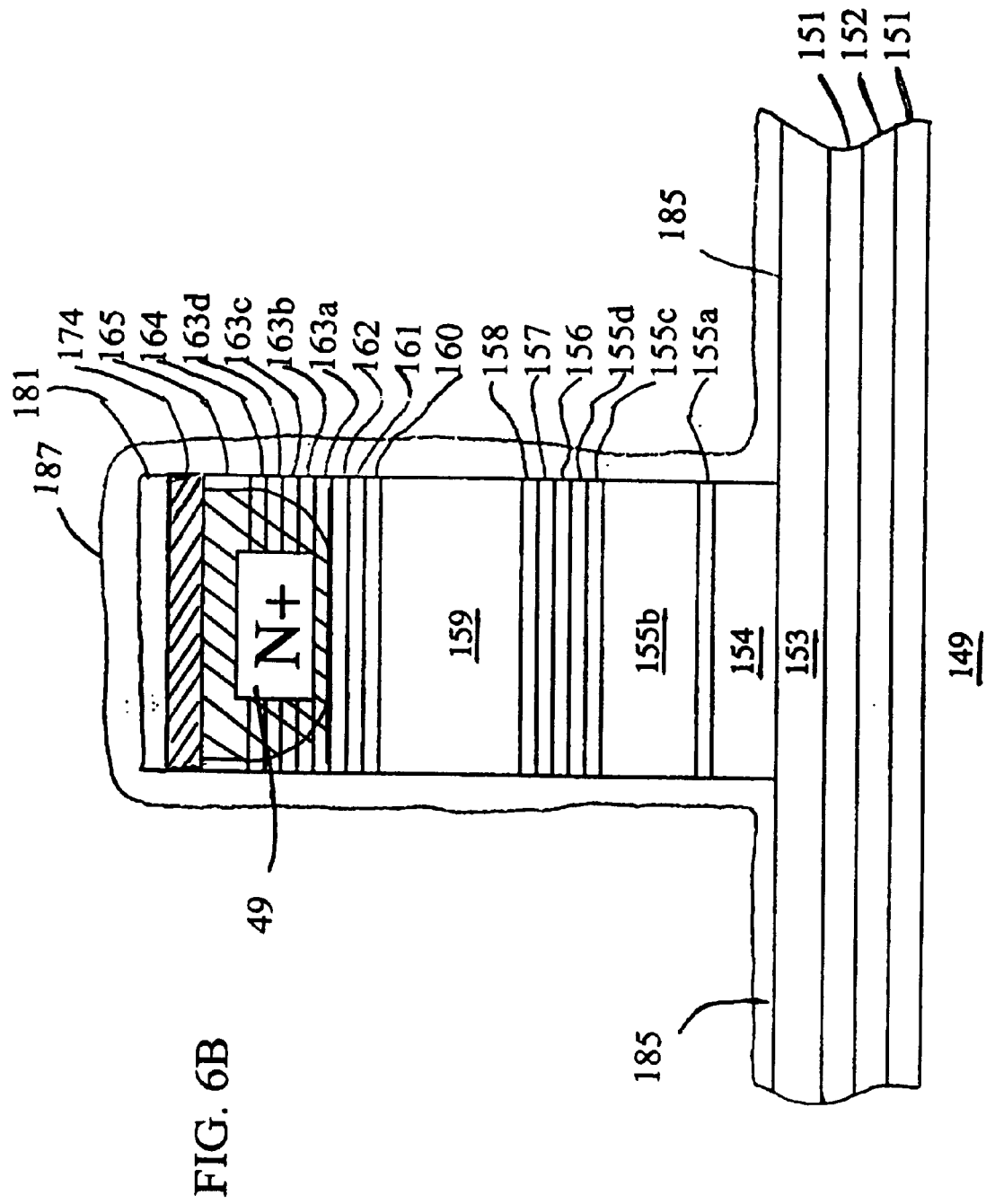

The resultant structure in then covered with a capping layer 187 as shown in FIGS. 6A and 6B. The capping layer 187 is preferably realized by a nitride film.

Figure 7A:
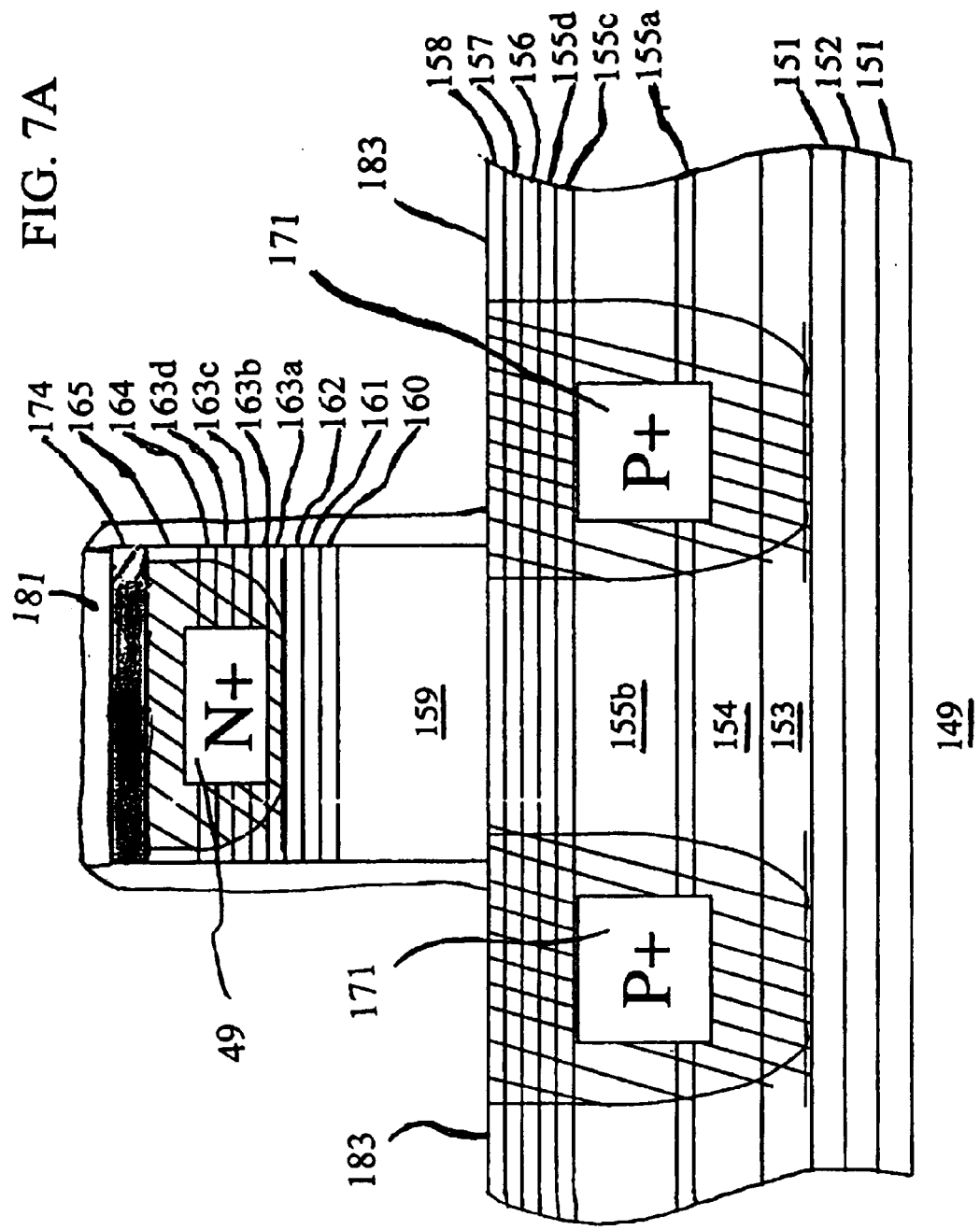
FIGS. 7A and 7B are cross-sectional schematic views that shows the result of a directional etching operation that exposes mesa areas for metal contact formation thereto.
Figure 7B:
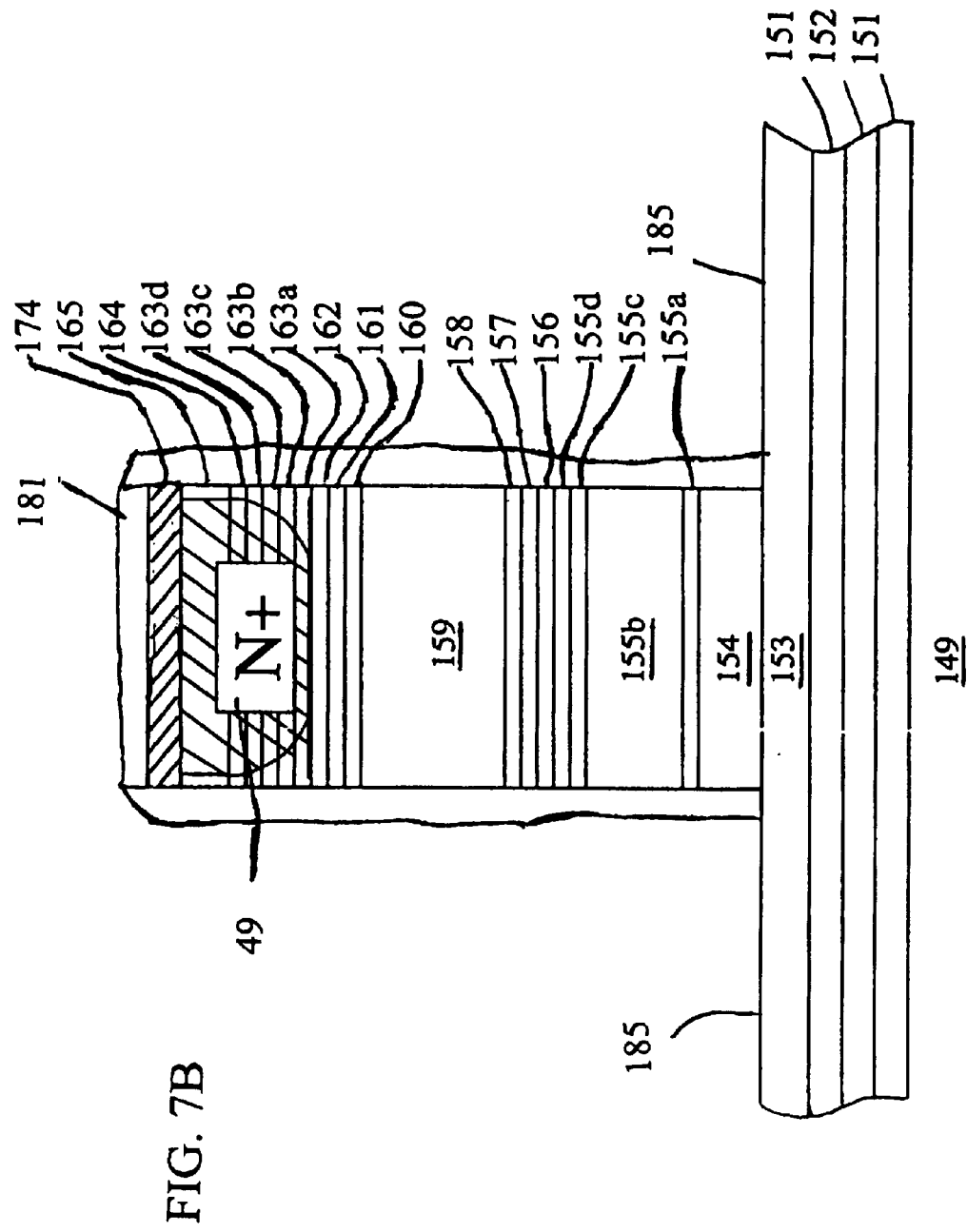

The capping layer 187 is then subject to a directional plasma etching operation that removes portions of the capping layer 187 over the mesa regions 183, 185 as shown in FIGS. 7A and 7B. The directional plasma etching operation also removes portions of the capping layer 187 that covers the top capping layer 181. Importantly, the top capping layer 181 (or portions thereof) remains in place to protect against shorts between the metal layer 174 and the metal layers 189, 191 as described below.

Figure 8A:
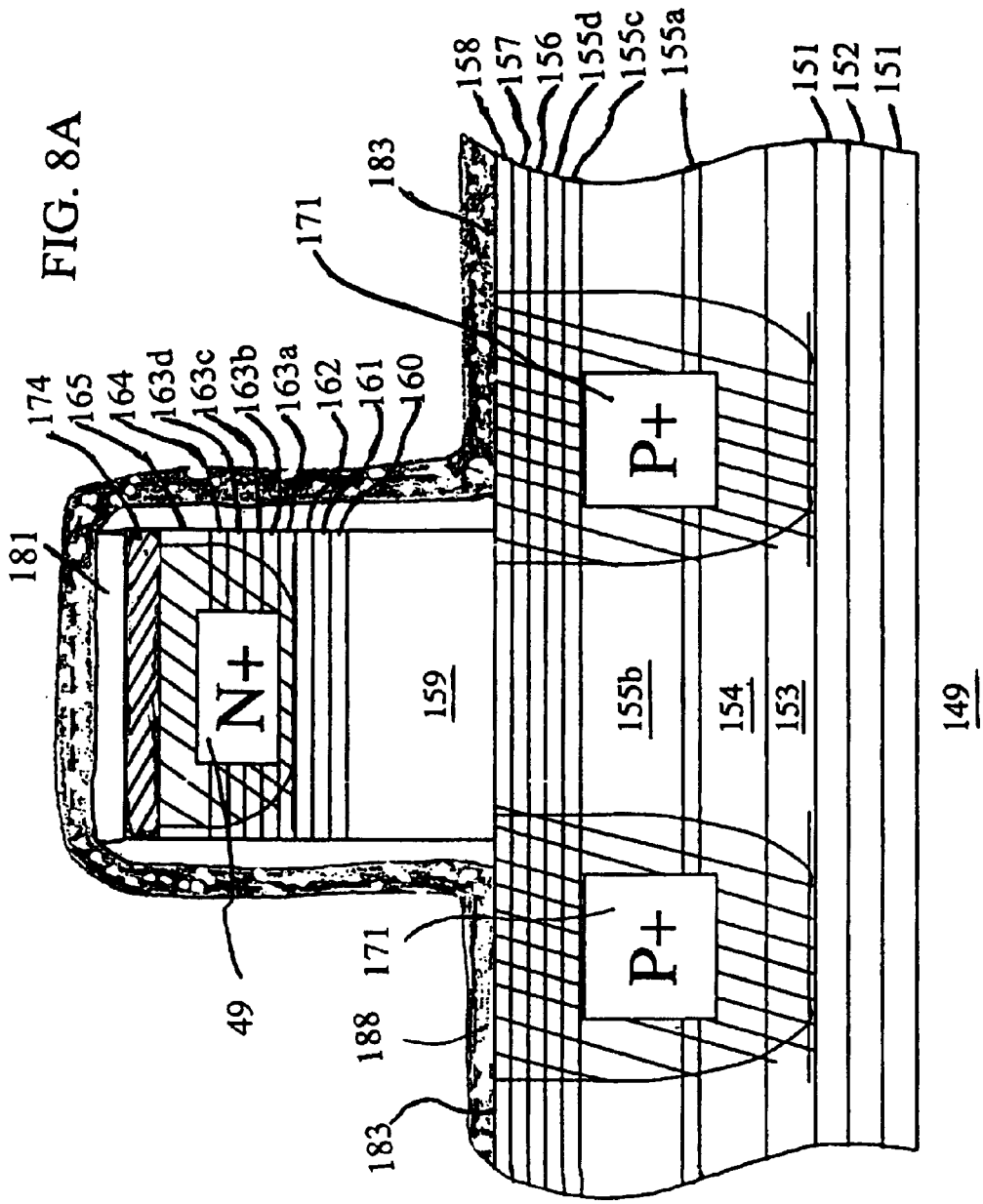
FIGS. 8A, 8B, 9A and 9B are cross-sectional schematic views that show the formation of the base metal layer and the emitter metal layer, respectively.
Figure 8B:
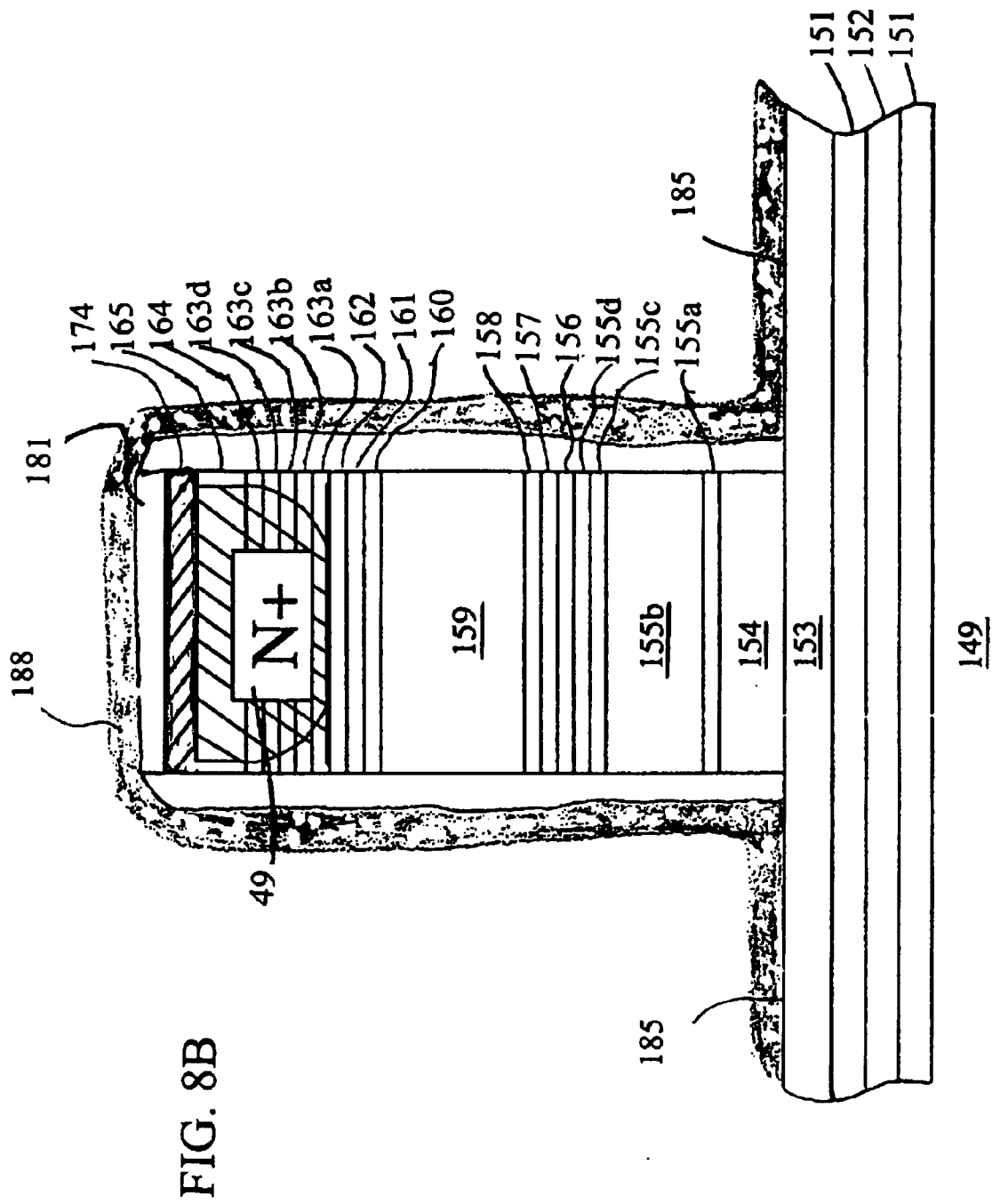

The resultant structure is then covered with a metal layer 188 as shown in FIGS. 8A and 8B. Preferably, the metal layer 188 comprises a composite metal structure formed by depositing Nickel (Ni), Indium (In) and Tungsten (W) metals. For those portions of the NiInW composite metal structure that interface to the p-type implant regions 171, such NiInW composite metal portions are transformed during an RTA operation as set forth below into a thermally-stable low resistance metal layer in contact with the p-type implant regions 171. Similarly, for those portions of the NiInW composite metal structure that interface to the n-type contact layer 153, such NiInW composite metal portions are transformed during an RTA operation as set forth below into a thermally-stable low resistance metal layer in contact with the n-type contact layer 153. In this manner, the same NiInW composite metal structure is used to form low resistance metal contact layers to both the n-type and p-type GaAs conduction channels of the device. Exemplary NiInW composite metal structures are described in the articles to Murakami et al. and Hallili et al., which are incorporated by reference above. Such composite metal structures include an InAs/W multilayer structure, an InAs/Ni/W multilayer structure, an Ni/InAs/Ni/W multilayer structure, and Ni/Ni—In/Ni/W multilayer structure (where the Ni—In layer is formed by codeposition of Ni and In).

The device structure is then subjected to an RTA operation on the order of 800° C. to 900° C. (or greater). The RTA has two primary purposes. First, it activates all of the implants to form the n-type implant region 49 and the p-type implant regions 171. Secondly, it transforms the composite metal structure of layers 174 and 188 to form low resistance metal contact layers to both the n-type and p-type conduction channels of the device. Also note that during the RTA, the metal composite layers 174 and 188 provide barrier layers to out-diffusion of the particular implanted ion species that underlies such layers.

Figure 9A:
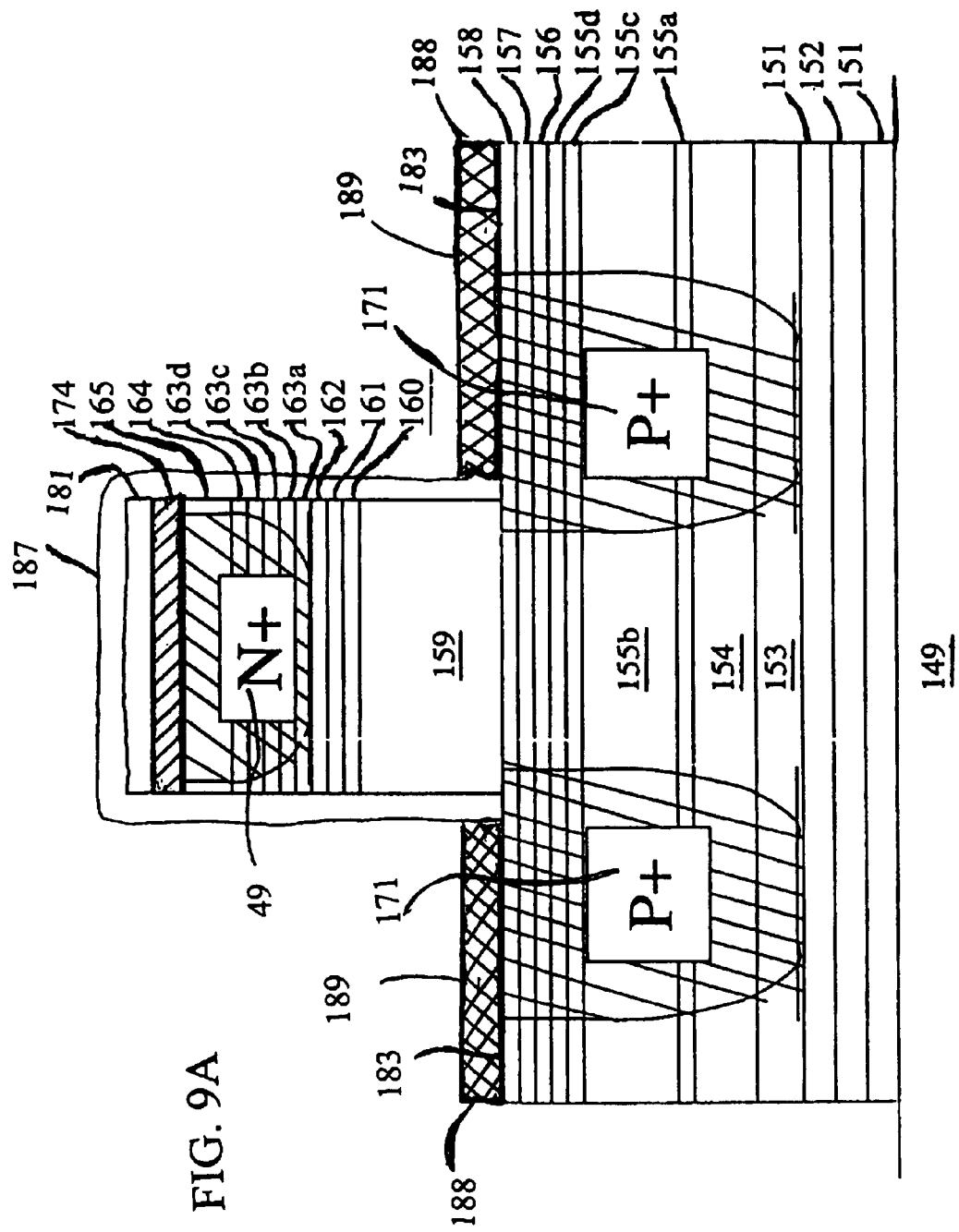
Figure 9B:
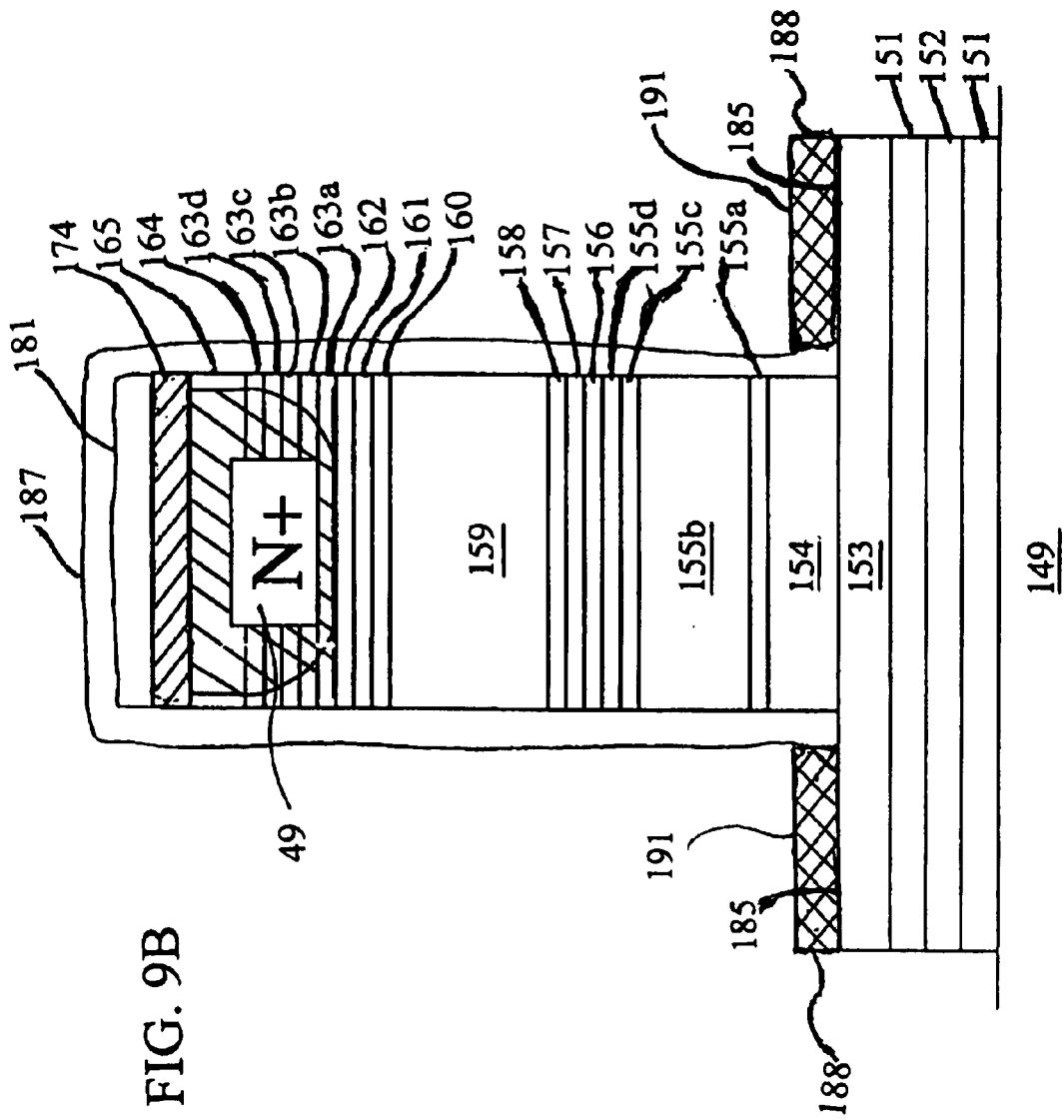

The metal layer 188 is then patterned and etched to form the base terminal electrode portions 189 and the emitter terminal electrode portions 191 of the p-type quantum-well-base bipolar transistor device. The base terminal electrode portions 189 cover the mesa regions 183 and corresponding p-type implants 171 as shown in FIG. 9A. The emitter terminal electrode portions 191 cover the mesa regions 185 at the n-type contact layer 153 as shown in FIG. 9B. In addition, the device is isolated from other devices by an etch down to the semi-insulating substrate 149, which includes an etch through the mirror pairs 151/152 of AlAs/GaAs as shown in FIGS. 9A and 9B.

Preferably, the metal layer 188 is patterned by a wet etchant that removes only those portions of the metal layer 188 that overlie the capping layer 187 (these portions do not interface to the p-type and n-type contacts of the device layers and are not transformed during RTA). The wet etchant does not react with those portions of the metal layer 188 that interface to the p-type and n-type contacts of the device layers (and which are transformed to a low resistance contact metal structure during RTA). An example of such a wet etchant suitable for use with the exemplary NiInW composite metal structures is sold by the Transene Company under the name TFG. Note that during the RTA, the Ni/Ni—In/Ni/W composite structure that overlies the GaAs-based layers of the mesa regions 183, 185 interacts with the GaAs layers thereunder to transform part of the composite structure adjacent to such mesa regions 183, 185 to InGaAs. The wet etchant does not attack these InGaAs structures yet attacks the Ni-based composite structures that overlie the capping layer 187, thus leaving behind the InGaAs structures as an appropriate ohmic contact (p-type for base, or n-type for emitter) to the underlying GaAs layers. Preferably, the isolation etch down to the semi-insulating substrate 149 is accomplished by a directional plasma etching operation.

Finally, the device may be oxidized in a steam ambient to convert layers 151 to AlO, which form the bottom DBR mirror. During this oxidation step, the exposed sidewalls of the etched AlGaAs layers are passivated by the formation of very thin layers of oxide. In addition, dielectric layers (not shown) are deposited to form the top DBR mirror for resonant cavity devices as described below. Preferably, the dielectric layers comprise $SiO_2$ and a high refractive index material such as GaAs, Si, or GaN.

Figure 10:
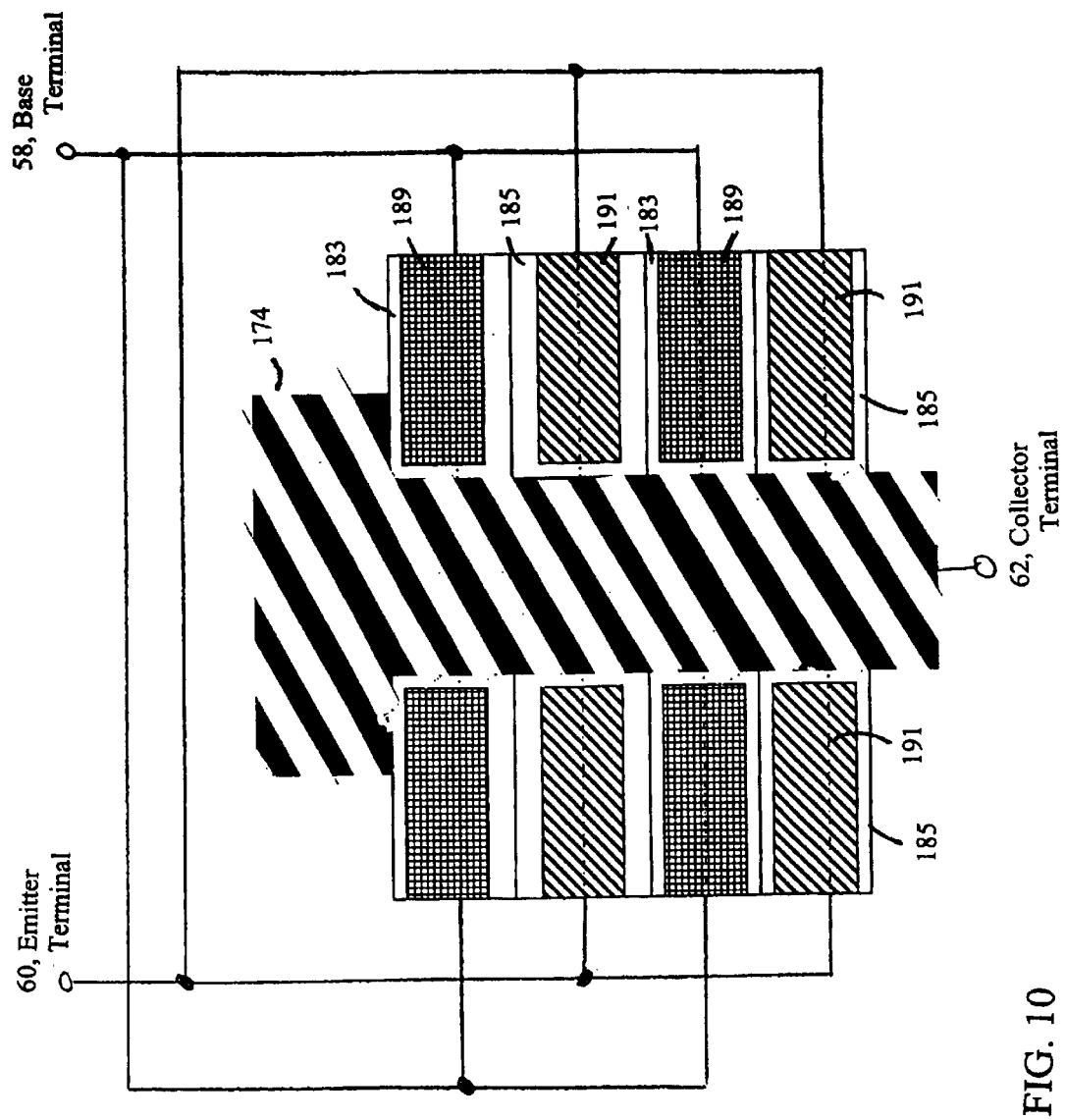

A plan schematic view of the resultant p-type quantum well base bipolar transistor device is shown in FIG. 10. Note that the process methodology described above enables the offset (in the lateral direction) between the active device structure and the base metal layer pattern 189 and the emitter metal layer pattern 191, respectively, to substantially correspond to the thickness of the capping layer 187. Preferably, the thickness of the capping layer 187 can be made small (on the order of 200 Å to 500 Å). By reducing this offset, the base terminal resistance and the emitter terminal resistance are decreased. By decreasing such resistance values, the transconductance ($g_m$) and cutoff frequency of the device is increased. In this manner, the device can be used in higher frequency applications.

For a high performance p-type quantum-well-base bipolar transistor device, it is preferable that the effective area of the base-collector junction in addition to the effective area of the base-emitter junction be minimized. This reduces the base-collector capacitance and the base-emitter capacitance, and thus provides for higher frequency operation. Moreover, it is preferable that the resistance of the base terminal, the resistance of the collector terminal and the resistance of the emitter terminal be minimized to provide for higher frequency operation.

In the p-type quantum-well-base bipolar transistor device of FIGS. 3 through 10, the effective area of the base-collector junction is controlled by the dimensions of the collector electrode metal layer 174. The resistance of the collector is minimized by controlling the doping concentration of the collector contact (N+ implant 49). Finally, the effective area of the base-emitter junction in addition to the base terminal resistance and emitter terminal resistance are minimized by interdigitization of the P+-type implants 171/base electrode portions 189 with respect to the emitter electrode portions 191 on both sides of the collector metal layer 174. As shown in FIGS. 5A through 9A, the P+ implants 171 are formed in selected areas on both sides of the collector metal layer 174. Importantly, these implants 171 are deep to a point near the dielectric layer 151, which reduces the effective area of the base-emitter junction, and eliminates much of the capacitance between the base and the emitter (e.g., the capacitance is reduced to that which exists along the sidewalls of the implants 171). Advantageously, the finger regions of metal layers 189/191 that are part of the base terminal electrode 58 and emitter terminal electrode 60 as shown in FIG. 10 provide very low base terminal resistance and emitter terminal resistance, respectively. In addition, because the implants are 171 are self-aligned to the metal layer 174, the width of the metal layer 174 may be minimized (preferably, to sub-micron widths). All of these features contribute to higher frequency operation of the device.

For high performance quantum-well-base bipolar transistor devices, it is also preferable that the vertical distance between the QW base and the emitter/collector of the device be minimized. Such reduced vertical dimensions reduce the transit time delay of charge passing therethrough, and thus provides for higher frequency operation. Advantageously, the vertical dimension between the n-type ohmic contact layer 153 and the top electrode metal layer 174 can be made small (e.g., on the order of 370–655 Å) to provide for high frequency operation.

There are many advantages gained by the p-type quantum-well-base transistor device structures described herein including high frequency operation. Moreover, a broad array of optoelectronic devices and electronic devices can be integrated therewith to form a monolithic optoelectronic integrated circuit suitable for many diverse applications. Such devices include an optoelectronic thyristor. The thyristor has unique properties of sensitive detection in its OFF state and laser emission in its ON state. The thyristor structure may be used as a digital modulator, a transceiver, an amplifier and a directional coupler. These devices may be realized as either waveguide or vertical cavity devices. The vertical cavity construction enables resonant cavity operation of all device modes. In addition to the multiple optoelectronic devices, a wide array of transistor devices (including complementary HFET devices and complementary quantum-well-base bipolar transistors) are implementable.

There have been described and illustrated herein several embodiments of a p-type quantum-well-base bipolar transistor. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. Additionally, while particular formation and metallization techniques have been described, it will be appreciated that the described structures can be formed in other manners, and other metals can be used. For example, it is contemplated that the collector of the p-type quantum-well-base bipolar transistor device of FIGS. 3 through 10 can be formed by etching away portions of the top of multilayer structure of FIG. 2A prior to implantation of the n-type implant 49 and metallization of the collector metal pattern. These operations are similar to those described in detail in U.S. application Ser. Nos. 10/340,941 and 10/340,942, filed on Jan. 13, 2003, incorporated by reference above in their entirety. Further, while particular arrangements of bipolar transistors (as well as FET transistors, optical emitters, detectors, modulators, amplifiers, etc. formed from the described semiconductor structure) have been described, it will be appreciated that other devices can be made from the provided structure and components. It will therefore be appreciated by those skilled in the art that yet other modifications could be made to the provided invention without deviating therefrom.

What is claimed is:

1. A transistor device comprising:
   a series of layers formed on a substrate, said layers including a first set of one or more layers each comprising n-type dopant material, a second set of layers forming a p-type modulation doped quantum well structure, and a third set of one or more layers each comprising n-type dopant material, wherein said first set of layers includes an n-type ohmic contact layer;
   a collector terminal metal layer that is formed on one layer of said third set;
   a plurality of p-type ion implant regions that are disposed on opposite sides of said collector terminal metal layer, said p-type ion implant regions operably coupled to said p-type modulation doped quantum well structure;
   a patterned base terminal metal layer that is formed on said p-type ion implant regions for contact to said p-type modulation doped quantum well structure; and
   a patterned emitter terminal metal layer that is formed on said n-type ohmic contact layer on said opposite sides of said collector terminal metal layer;
   wherein said patterned base terminal metal layer is interdigitated with respect to said patterned emitter terminal layer on both of said opposite sides of said collector terminal metal layer.

2. A transistor device according to claim 1, further comprising:
a first capping layer that is formed above said collector terminal metal layer.

3. A transistor device according to claim 2, wherein:
said first capping layer comprises a silicon nitride film.

4. A transistor device according to claim 1, further comprising:
a top mesa upon which is formed said collector metal layer, a plurality of first mesas upon which is formed said patterned base terminal metal layer, and a plurality of second mesas upon which is formed said patterned emitter terminal metal layer; and
a second capping layer that covers sidewalls that extend from said plurality of first mesas to said top mesa as well as sidewalls that extend from said plurality of second mesas to said top mesa.

5. A transistor device according to claim 4, wherein:
said second capping layer covers said plurality of first mesas and said plurality of second mesas prior to metallization that forms said patterned base terminal metal layer and said patterned emitter terminal metal layer.

6. A transistor device according to claim 4, wherein:
at least one of said a collector terminal metal layer, said base terminal metal layer, and said emitter terminal metal layer are formed from a composite metal structure that is transformed into a low resistance metal layer by a rapid-thermal anneal operation.

7. A transistor device according to claim 6, wherein:
at least said base terminal metal layer and said emitter terminal metal layer are formed by deposition of a common composite metal structure.

8. A transistor device according to claim 6, wherein:
said composite metal structure protects against out diffusion of implanted ion species during the rapid thermal anneal operation.

9. A transistor device according to claim 6, wherein:
said low resistance metal layer is patterned with an etchant that selectively etches away portions of the composite metal structure that overlie said second capping layer.

10. A transistor device according to claim 6, wherein:
said composite metal structure comprises a multilayer sandwich that includes Nickel (Ni), Indium (In) and Tungsten (W) metals.

11. A transistor device according to claim 1, wherein:
said first set and second set of layers comprise epitaxial layers.

12. A transistor device according to claim 11, wherein:
said epitaxial layers are formed by molecular beam epitaxy.

13. A transistor device according to claim 1, wherein:
said third set of one or more layers is formed by ion implantation of n-type ions into a plurality of epitaxial layers.

14. A transistor device according to claim 13, wherein:
said plurality of epitaxial layers comprise a plurality of p-type layers.

15. A transistor device according to claim 13, wherein:
said plurality of epitaxial layers comprise at least one layer of an n-type modulation doped quantum well structure.

16. A transistor device according to claim 1, further comprising:
at least one undoped spacer layer disposed between said first set and said second set of layers; and
at least one undoped spacer layer disposed between said second set and said third set of layers.

17. A transistor device according to claim 1, wherein:
said second set of layers comprise at least one layer of undoped InGaAsN and at least one layer of undoped GaAs that form at least one quantum well.

18. A transistor device according to claim 1, wherein:
said second set of layers comprise at least one layer of AlGaAs of high p-type doping concentration to form a modulation doped layer for said at least one quantum well.

19. A transistor device according to claim 1, wherein:
said series of layers comprises group Ill-V materials.

20. A transistor device according to claim 1, wherein:
said series of layers comprises strained silicon heterostructures employing silicon-germanium (SiGe) layers.

21. A method of fabricating a transistor device comprising:
providing a series of layers formed on a substrate, said layers including a first set of one or more layers each comprising n-type dopant material, a second set of layers forming a p-type modulation doped quantum well structure, and a third set of one or more layers each comprising n-type dopant material, wherein said first set of layers includes an n-type ohmic contact layer;
depositing and patterning a collector terminal metal layer on one layer of said third set;
performing an etching operation that exposes a plurality of first mesas that are disposed on opposite sides of said collector terminal metal layer, and performing an ion implant of p-type ions through said first mesas to form a plurality of p-type ion implant regions that are disposed on said opposite sides of said collector terminal metal layer, said p-type ion implant regions operably coupled to said p-type modulation doped quantum well structure;
performing an etching operation that exposes a plurality of second mesas at said n-type ohmic contact layer that are disposed on said opposite sides of said collector terminal metal layer;
depositing and patterning a base terminal metal layer on portions of said first mesas, said portions being part of said p-type ion implant regions; and
depositing and patterning an emitter terminal metal layer on portions of said mesas at said n-type ohmic contact layer;
wherein said base terminal metal layer is interdigitated with respect to said emitter terminal metal layer on both of said opposite sides of said collector terminal metal layer.

22. A method of fabricating a transistor device according to claim 21, further comprising:
forming a first capping layer above said collector terminal metal layer.

23. A method of fabricating a transistor device according to claim 22, wherein:
said first capping layer comprises a nitride film.

24. A method of fabricating a transistor device according to claim 21, wherein:
said collector terminal metal layer is formed upon a top mesa, and a second capping layer is formed such that it covers sidewalls that extend from said first mesas to said top mesa as well as sidewalls that extend from said second mesas to said top mesa.

25. A method of fabricating a transistor device according to claim 24, wherein:

said second capping layer covers said plurality of first mesas and said plurality of second mesas prior to metallization that forms said base terminal metal layer and said emitter terminal metal layer.

26. A method of fabricating a transistor device according to claim 24, wherein:

at least one of said a collector terminal metal layer, said base terminal metal layer, and said emitter terminal metal layer are formed from a composite metal structure that is transformed into a low resistance metal layer by a rapid-thermal anneal operation.

27. A method of fabricating a transistor device according to claim 26, wherein:

at least said base terminal metal layer and said emitter terminal metal layer are formed by deposition of a common composite metal structure.

28. A method of fabricating a transistor device according to claim 26, wherein:

said composite metal structure protects against out diffusion of implanted ion species during the rapid thermal anneal operation.

29. A method of fabricating a transistor device according to claim 26, wherein:

said low resistance metal layer is patterned with an etchant that selectively etches away portions of the composite metal structure that overlie said second capping layer.

30. A method of fabricating a transistor device according to claim 26, wherein:

said composite metal structure comprises a multilayer sandwich that includes Nickel (Ni), Indium (In) and Tungsten (W) metals.

31. A method of fabricating a transistor device according to claim 21, wherein:

said first set and second set of layers comprise epitaxial layers.

32. A method of fabricating a transistor device according to claim 31, wherein:

said epitaxial layers are formed by molecular beam epitaxy.

33. A method of fabricating a transistor device according to claim 21, wherein:

said third set of one or more layers is formed by ion implantation of n-type ions into a plurality of epitaxial layers.

34. A method of fabricating a transistor device according to claim 33, wherein:

said plurality of epitaxial layers comprise a plurality of p-type layers.

35. A method of fabricating a transistor device according to claim 33, wherein:

said plurality of epitaxial layers comprise at least one layer of an n-type modulation doped quantum well structure.

36. A method of fabricating a transistor device according to claim 21, wherein:

at least one undoped spacer layer disposed between said first set and said second set of layers; and at least one undoped spacer layer disposed between said second set and said third set of layers.

37. A method of fabricating a transistor device according to claim 21, wherein:

said second set of layers comprise at least one layer of undoped InGaAsN and at least one layer of undoped GaAs that form at least one quantum well.

38. A method of fabricating a transistor device according to claim 21, wherein:

said second set of layers comprise at least one layer of AlGaAs of high p-type doping concentration to form a modulation doped layer for said at least one quantum well.

39. A method of fabricating a transistor device according to claim 21, wherein:

said series of layers comprises group III-V materials.

40. A method of fabricating a transistor device according to claim 21, wherein:

said series of layers comprises strained silicon heterostructures employing silicon-germanium (SiGe) layers.

* * * * *